(12) United States Patent
Büttner et al.

(10) Patent No.: US 10,614,013 B2
(45) Date of Patent: Apr. 7, 2020

(54) INPUT/OUTPUT MODULE FOR A BUS SYSTEM

(71) Applicant: BECKHOFF AUTOMATION GMBH, Verl (DE)

(72) Inventors: Holger Büttner, Berlin (DE); Thomas Rettig, Rheda-Wiedenbrück (DE); Dirk Bechtel, Bielefeld (DE); Michael Jost, Dörentrup (DE); Christopher Pohl, Verl (DE); Hans Beckhoff, Verl (DE)

(73) Assignee: Beckhoff Automation GmbH, Verl (DE)

( * ) Notice: Subject to any disclaimer, the term of this patent is extended or adjusted under 35 U.S.C. 154(b) by 0 days.

(21) Appl. No.: 15/459,804

(22) Filed: Mar. 15, 2017

(65) Prior Publication Data

US 2017/0185556 A1 Jun. 29, 2017

Related U.S. Application Data

(63) Continuation of application No. PCT/EP2016/073123, filed on Sep. 28, 2016.

(30) Foreign Application Priority Data

Oct. 2, 2015 (DE) .................. 10 2015 116 800

(51) Int. Cl.
*G06F 13/40* (2006.01)
*H04L 12/40* (2006.01)
(Continued)

(52) U.S. Cl.
CPC ....... *G06F 13/4022* (2013.01); *G01R 31/043* (2013.01); *G06F 1/3287* (2013.01);
(Continued)

(58) Field of Classification Search
CPC .. G06F 13/4022; G06F 1/3287; G06F 1/3296; G06F 13/4282; H01R 13/658; H01R 33/74
See application file for complete search history.

(56) References Cited

U.S. PATENT DOCUMENTS 6,218,930 B1 * 4/2001 Katzenberg ............. H04L 12/10
340/12.32
8,779,786 B2 * 7/2014 Maniktala ............... H04L 12/12
324/526
(Continued)

FOREIGN PATENT DOCUMENTS

CN 101401003 * 1/2009
CN 101401003 A 4/2009
(Continued)

*Primary Examiner* — Tim T Vo
*Assistant Examiner* — Harry Z Wang
(74) *Attorney, Agent, or Firm* — Dorsey & Whitney LLP

(57) ABSTRACT

An input/output module is provided for a bus system having a socket, the five contact cups of which each may comprise an electrical contact, and a measuring device for detecting a connector of a four-wire data cable. The measuring device can be configured to detect, when a connector is inserted into the socket, whether the connector comprises four or five electrical contact pins which are each plugged into one of the contact cups and are electrically connected to the respective electrical contact of the contact cups. The measuring device may be configured to close a first and a second switching device only when five electrical contact pins are detected in order to apply a respective supply voltage from two DC voltage supplies to the corresponding plugged contact pins of the connector plugged into the socket via the respective electrical contacts of the contact cups.

19 Claims, 10 Drawing Sheets

(51) Int. Cl.

|  |  |
|---|---|
| *G01R 31/04* | (2006.01) |
| *H04L 12/10* | (2006.01) |
| *G06F 1/3287* | (2019.01) |
| *G06F 1/3296* | (2019.01) |
| *G06F 13/42* | (2006.01) |
| *H01R 13/658* | (2011.01) |
| *H01R 33/74* | (2006.01) |

(52) U.S. Cl.
CPC ........ *G06F 1/3296* (2013.01); *G06F 13/4282* (2013.01); *H01R 13/658* (2013.01); *H01R 33/74* (2013.01); *H04L 12/10* (2013.01); *H04L 12/40045* (2013.01)

(56) References Cited

U.S. PATENT DOCUMENTS

| 2008/0150512 A1* | 6/2008 | Kawano | G06F 1/266 |
|---|---|---|---|
|  |  |  | 323/351 |
| 2010/0244587 A1* | 9/2010 | Tiovola | G06F 13/4081 |
|  |  |  | 307/130 |
| 2012/0080212 A1 | 4/2012 | Gabriel |  |
| 2013/0223293 A1* | 8/2013 | Jones | H04L 5/14 |
|  |  |  | 370/276 |

FOREIGN PATENT DOCUMENTS

| DE | 10163393 A1 | 7/2003 |
| DE | 102010061188 A1 | 1/2012 |
| DE | 102011087828 A1 | 6/2013 |
| DE | 102013201106 A1 | 7/2014 |
| WO | 2015007523 A1 | 1/2015 |

\* cited by examiner

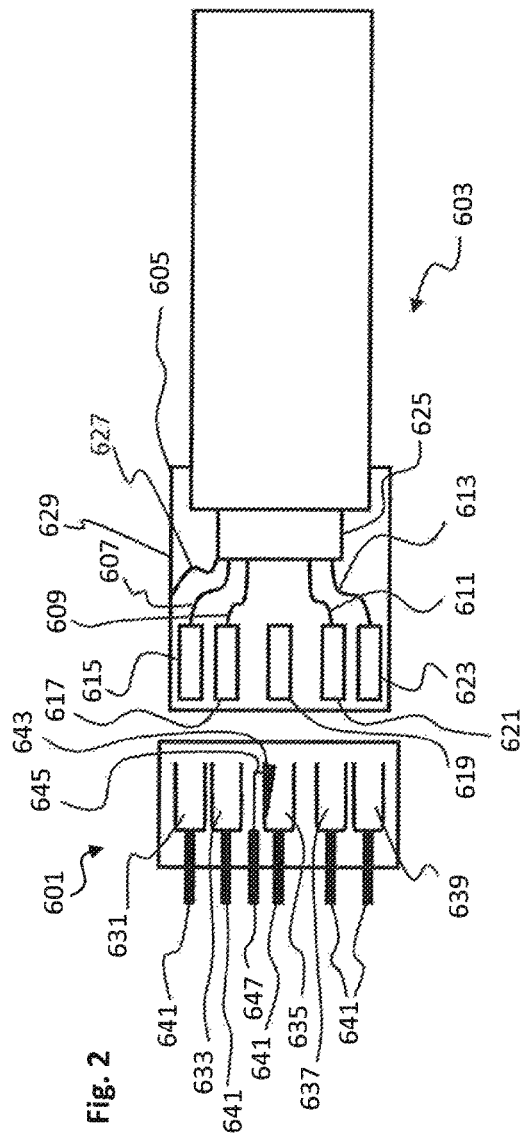
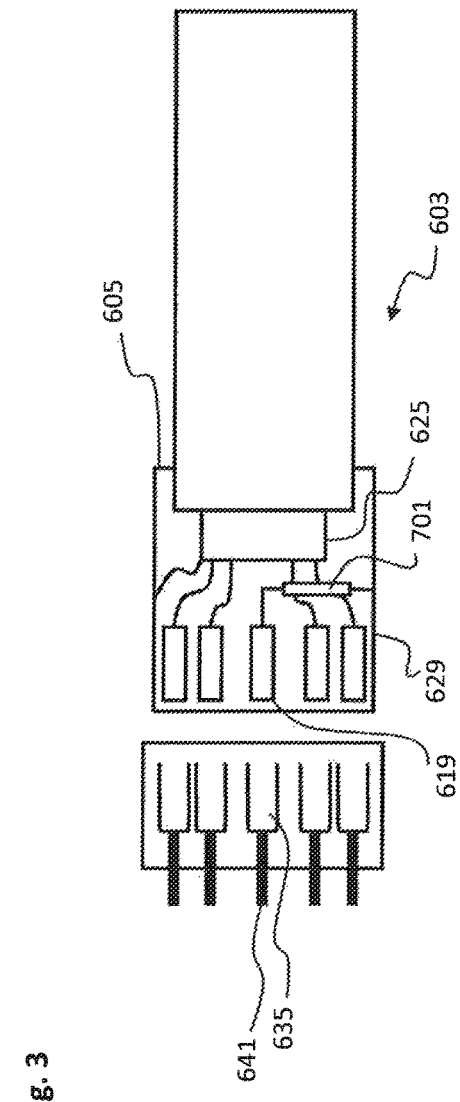

INPUT/OUTPUT MODULE FOR A BUS SYSTEM

CROSS-REFERENCE TO RELATED APPLICATIONS

This patent application claims priority to international application PCT/EP2016/073123, filed Sep. 28, 2016, and German patent application DE 10 2015 116 800.6, filed Oct. 2, 2015, entitled EINGABE-/AUSGABEMODUL FüR EIN BUSSYSTEM, for each of which the disclosure and content is incorporated by reference herein, in the entirety and for all purposes.

FIELD

This invention relates to an input/output module for a bus system. The invention also relates to a method for operating an input/output module for a bus system. The invention also relates to a data cable.

BACKGROUND

Modern concepts in industrial automation, that is to say the control and monitoring of technical processes with the aid of software, are based on the idea of a central controller with a distributed sensor/actuator level. In this case, the subscribers communicate with one another and with superordinate systems via industrial data networks, also referred to as automation networks below.

Ethernet is the most widespread communication standard in local area networks and is stipulated, in particular, by the IEEE standard 802.3. Ethernet is based on a LAN structure in which a plurality of control nodes, for example computers or machines, are connected to one another in a wired manner, the Ethernet protocol encapsulating the data to be transmitted in data packets, also referred to as a message below, with a predetermined format. In this case, it is possible to use different Ethernet variants which differ in terms of the transmission rate, the cable types used and the line coding.

Communication between the subscribers generally takes place via a data line having four wires in industrially used Ethernet networks, the four wires often being in the form of two twisted pairs of wires. Twisting the pairs of wires reduces crosstalk. The two wires in a pair of wires are always used together, a differential data signal being transmitted via one pair of wires in each case. Sometimes, all four wires are also twisted together, which, although resulting in disadvantages in terms of the electromagnetic compatibility, has the advantage of a higher degree of flexibility of the line.

An often compulsory requirement imposed on existing automation networks is that the outputs of a machine, the actuators, can be changed to a safe state at any time without losing the possibility of monitoring the machine. The sensors and the controller in the automation network must therefore be able to be operated independently of the actuators. For this reason, the energy supply for the actuators is generally separate from the energy supply for the sensors and the controller in order to disconnect the actuator supply independently of the sensor and controller supply.

The energy supply lines needed in the automation network are generally laid independently of the data line, which makes it necessary to have at least two dedicated cabling systems with the corresponding contact technology. However, in industrial automation, it is desirable to always achieve cabling which is as cost-effective and simple as possible in the automation network. This is important, in particular, when good shielding, a high protection class or a high temperature resistance is required for the cabling on account of environmental requirements. The cabling is therefore often responsible for a relevant high proportion of the system costs.

One approach to saving costs in the cabling is to combine the power supply and the data transmission in one cabling system. With the aid of the so-called "Power over Ethernet" standard, an individual voltage can therefore be concomitantly transmitted in addition to the two differential data signals on the two twisted pairs of wires using a four-wire standard Ethernet data line. A specially adapted Ethernet transformer is used for this purpose in the PoE standard, which transformer applies the two potentials required for the voltage to each pair of wires via a centre tap. However, since two separate energy supplies are often required in industrial automation, one for the actuators and the other for the sensors and the controller, an additional cabling system for a second energy supply is also required in a PoE system having a four-wire data line.

The concept of the PoE system can be applied to automation, with the result that it is possible to provide a user with the possibility of connecting automation devices (for example input/output modules) using only one line instead of the otherwise conventional two lines (communication and voltage supply). For this purpose, two supply voltages and two differential data signals are transmitted on the same line, the line comprising two pairs of wires, and are separated from one another with the aid of an electronic circuit.

Devices which master this technology (that is to say the transmission of two supply voltages and two differential data signals via the same line) cannot be readily connected to devices which do not master this technology since, in the devices which do not master this technology, a supply voltage would otherwise be applied to the communication components, which may result in (irreparable) damage in the device.

The published patent application US 2013/0093444 A1, now U.S. Pat. No. 8,779,786 B2, and the patent specification U.S. Pat. No. 6,218,930 B1 each show a possible way of detecting capabilities of remote devices.

SUMMARY

An object of the present disclosure is to provide an improved an input/output module for a bus system, efficient concept which can be used to help ensure that an input/output module does not use a data line to provide a remote further input/output module, which is connected to the input/output module via the data line, with a supply voltage if the remote further input/output module is not configured to receive an electrical supply voltage via the data line.

EXAMPLES

In various examples and embodiments, one aspect provides an input/output module for a bus system, e.g., comprising one or more of:
  a first DC voltage supply and a second DC voltage supply,
  a physical interface, a first transformer, a second transformer, a first inductive subassembly, a second inductive subassembly, a first capacitive subassembly, a second capacitive subassembly, a first switching device and a second switching device,
  a socket having five contact cups, the five contact cups each comprising an electrical contact, the first DC voltage supply being able to be electrically connected to a respective electrical contact of two of the five contact cups via the first inductive subassembly by means of the first switching device, the second DC voltage supply being able to be electrically connected to a respective electrical contact of two others of the five contact cups via the second inductive subassembly by means of the second switching device, the physical interface being electrically connected to the respective electrical contacts of the two of the five contact cups via the first transformer and via the first capacitive subassembly in order to apply a first differential data signal to the two electrical contacts of the two of the five contact cups, the physical interface being electrically connected to the respective electrical contacts of the two others of the five contact cups via the second transformer and via the second capacitive subassembly in order to apply a second differential data signal to the two electrical contacts of the other two of the five contact cups, and a measuring device for detecting a connector of a four-wire data cable, which measuring device is configured to detect, when a connector is inserted into the socket, whether the connector comprises four or five electrical contact pins which are each plugged into one of the contact cups and are electrically connected to the respective electrical contact of the contact cups, the measuring device being configured to close the first and second switching devices only when five electrical contact pins are detected in order to apply a respective supply voltage of the two DC voltage supplies to the corresponding plugged contact pins of the connector plugged into the socket via the respective electrical contacts of the contact cups.

In various examples and embodiments, another aspect provides a method for operating an input/output module for operating the input/output module, e.g., comprising one or more of the following steps of:

using the measuring device to detect, when a connector is inserted into the socket, whether the connector comprises four or five electrical contact pins which are each plugged into one of the contact cups and are electrically connected to the respective electrical contact of the contact cups, using the measuring device to close the two switching devices only when five electrical contact pins are detected, with the result that a respective supply voltage of the two DC voltage supplies is applied to the corresponding plugged contact pins of the connector plugged into the socket via the respective electrical contacts of the contact cups on account of the closed switching devices.

In various examples and embodiments, another aspect provides a data cable for an input/output module for a bus system, e.g., comprising:

two pairs of wires, a connector with five electrical contact pins, four of the five electrical contact pins being electrically connected to a respective one of the wires of the two pairs of wires.

In various examples and embodiments, another aspect provides a bus system comprising the input/output module and the data cable.

In various examples and embodiments, another aspect provides a computer program comprising program code for carrying out the method for operating the input/output module when the computer program is executed on a computer, in particular on the input/output module.

The inventive concepts described herein can help ensure that an input/output module does not use a data line to provide a remote further input/output module, which is connected to the input/output module via the data line, with a supply voltage if the remote further input/output module is not configured to receive an electrical supply voltage via the data line.

One concept, in particular, provides an input/output module which is configured to provide both differential data signals and a voltage supply via a four-wire data cable. On account of the inductive and capacitive subassemblies being provided, it is advantageously possible to apply two DC-isolated DC voltages to the four wires of the data cable. Two DC-isolated direct currents can therefore be advantageously transmitted in a parallel manner, in addition to two differential data signals, on the two pairs of wires of the data cable using only a single cabling system, that is to say the data cable. A functionality of the bus system is therefore not changed, with the result that any desired bus structures such as star, line or ring are possible and are also provided according to other embodiments.

According to one embodiment, the bus system is suitable for use in industrial automation, that is to say it is an industrial automation bus system.

A separate energy supply for actuators and/or sensors and/or a controller can be ensured with the aid of the two mutually DC-isolated direct currents carried via the four-wire data cable. It is therefore advantageously possible to disconnect the actuator supply independently of the sensor and controller supply, with the result that it is possible to comply with a potentially compulsory requirement in industrial automation networks of being able at any time to change the outputs of a machine, that is to say the actuators, to a safe state without interrupting the communication with the machine, that is to say to be able to continue to address the sensors and the controller.

Providing the measuring device and the switching devices can advantageously make it possible to nevertheless connect a further input/output module, which is not designed for a voltage supply via the same pairs of wires of a data cable which are used to transmit the data signals, to the input/output module according to various embodiments of the invention. This is because an input/output module according to such embodiments may close the switching devices only if the measuring device detects that the connected connector of the data cable has five electrical contact pins. It is therefore advantageously possible to use a data cable having only four electrical contact pins for this further input/output module in order to connect the further input/output module to the input/output module according to various embodiments of the invention. This is because the measuring device detects only four electrical contact pins of the connected connector of the data cable in this case and in this respect will not close the two switching devices. In this respect, an electrical connection between the DC voltage supplies and the two and the two others of the five contact cups is electrically interrupted. Therefore, a DC voltage is not applied to the two and to the two others of the five contact cups. Only differential data signals are therefore advantageously transmitted via the four contact cups which are connected to the physical interface. This therefore advantageously prevents an electrical voltage being applied to communication components of the further input/output module. This advantageously prevents these communication components from being destroyed or damaged.

It can therefore advantageously be possible to provide a bus system comprising a plurality of input/output modules, this plurality of input/output modules being able to have different functionalities: some of these input/output modules may have a so-called PoE functionality, that is to say a voltage supply can be provided via the four wires of the data cable which also transmit the data signals. Other ones of the input/output modules do not have such a PoE functionality and can nevertheless be connected to these input/output modules without being damaged.

That is to say, in particular, examples and embodiments of the invention can provide for the data cable to be used to identify the connected subscriber, that is to say the further input/output module connected to the input/output module according to such examples and embodiments, in order to determine whether or not the input/output module can provide the further input/output module with a DC voltage via the four wires. That is to say, in particular, a decision is made on the basis of the data cable as regards whether or not the remote subscriber can be supplied.

According to one embodiment, the first differential data signal and the second differential data signal are each differential Ethernet signals. The bus system and the input/output module are therefore suitable, in particular, for use with Ethernet as the communication standard in the automation network. One embodiment therefore provides an automation network which comprises the bus system.

The switching devices can therefore act as switches in order to close or interrupt, that is to say open, an electrical connection between the corresponding DC voltage supply and the corresponding contact cups. The switching devices can therefore also be referred to as switch devices.

According to one embodiment, the switching device, that is to say generally the first and/or second switching device, comprises one or more mechanical switches and/or one or more electrical switches. An electrical switch is a transistor, for example.

One embodiment provides for the measuring device to be configured to apply an electrical measurement voltage between the electrical contact of the fifth contact cup, which differs from the two and the other two of the five contact cups, and an electrical reference contact and to measure an electrical current flowing between the reference contact and the electrical contact of the fifth contact cup, the electrical reference contact being electrically insulated from the electrical contact of the fifth contact cup, the measuring device being configured to close the two switching devices when an electrical current flowing between the electrical reference contact and the electrical contact of the fifth contact cup is measured when an electrical measurement voltage is applied.

In various examples and embodiments, this achieves the technical advantage, in particular, that it is possible to efficiently determine whether or not the supply voltage is intended to be enabled. In this case, the principle is based, in particular, on the fact that a current must not flow between the fifth contact cup and the electrical reference contact in the unplugged state if the measurement voltage is applied. If, in contrast, in the plugged state, that is to say if the connector is plugged into the socket, an electrical current flows between the electrical contact of the fifth contact cup and the electrical reference contact, it can be assumed that the connector is responsible for this current flow. For example, the connector comprises an electrical component which connects an electrical contact pin to a shield or screen of the data cable. That is to say, an electrical connection is provided between the electrical contact pin and the shield. If precisely this contact pin is now plugged into the fifth contact cup, an electrical connection is provided between the electrical contact of the fifth contact cup and the electrical reference contact if the electrical reference contact and the shield are both connected to ground or correspond to ground or are at a common potential, which is therefore also provided according to one embodiment.

If such a data cable comprising five contact pins is therefore detected, the voltage supply can be enabled. Another embodiment provides for the measuring device to comprise a transistor which is configured to switch on in the case of an electrical current flowing between the electrical reference contact and the electrical contact of the fifth contact cup, the measuring device being configured to detect when the transistor switches on and to close the two switching devices when switching-on of the transistor is detected.

In various examples and embodiments, this achieves the technical advantage, in particular, that it is possible to efficiently detect whether the data cable has four or five electrical contact pins. The switching-on of the transistor causes an efficiently produced signal for the measuring device indicating that the latter should or can close the switching devices. Providing a transistor advantageously makes it possible to achieve the situation in which the measurement signal can be amplified by means of the transistor immediately, that is to say instantly, to form a switching signal for switching the switching devices. This is a particularly efficient use of a transistor as a switch. According to one embodiment, the transistor forms the measuring device.

Another embodiment provides for the measuring device to be configured to determine, on the basis of the applied measurement voltage and the measured electrical current, what type of electrical component integrated in the connector has formed an electrical connection between the electrical reference contact and the electrical contact of the fifth contact cup.

In various examples and embodiments, this achieves the technical advantage, in particular, that it is possible to efficiently operate the input/output module on the basis of the information regarding which electrical component has established the electrical connection. This is because a particular operating parameter of the input/output module can be assigned to a particular electrical component, for example. That is to say, if a particular electrical component is detected, a particular operating parameter is used to operate the input/output module. For example, different electrical components may indicate or code different lengths of the data cable, with the result that different communication parameters are selected according to the cable length of the data cable. That is to say, a particular item of information is assigned to the electrical component. That is to say, a particular item of information is coded in the electrical component. According to another embodiment, a current-carrying capacity is also coded in addition to or instead of the line length on the basis of the measured properties. On the basis of this, another embodiment provides for the switch 1101 (cf. FIGS. 8 to 12 and corresponding description of the figures) described further below to then be changed over, a measurement of the line length on the basis of signal transit time measurements then being advantageously dispensed with according to another embodiment.

The electrical contact pins may be referred to as pins, in particular. Another embodiment provides for the measuring device to be configured to determine an electrical property (or a plurality of electrical properties) of the electrical component.

In various examples and embodiments, this achieves the technical advantage, in particular, that further information can be coded in the electrical component using the information relating to the electrical property, which further information can then be read using the measuring device. That is to say, the input/output module is operated on the basis of the determined electrical properties or the determined electrical property of the electrical component. Provision is therefore made, for example, for the input/output module to be operated differently in the case of different electrical properties. For example, a cable length of the connected data cable may be coded in the electrical property. The statements made above in this respect similarly also apply to this embodiment.

Another embodiment provides for the measuring device to be configured to determine a property of the plugged-in data cable on the basis of the applied measurement voltage and the measured electrical current.

In various examples and embodiments, this achieves the technical advantage, in particular, that a property of the plugged-in data cable can be efficiently determined. This is possible, in particular, as a result of the fact that, in a similar manner to the statements made above, the electrical component which establishes the connection between the electrical contact of the fifth contact cup and the electrical reference contact may have an item of coded information. In this case, coded therefore means, in particular, that the measuring device or generally the input/output module knows that the plugged-in data cable must have a particular property in the case of a particular measured property of the electrical component.

One embodiment provides a data memory which stores an assignment table which comprises an assignment of measured electrical properties of an electrical component to a property of a data cable.

Another embodiment provides for the measuring device to comprise an electrical switching contact, the electrical contact of the fifth contact cup, which differs from the two and the other two of the five contact cups, being movably mounted, with the result that, when an electrical contact pin of the connector is inserted into the fifth contact cup, the electrical contact pin inserted into the fifth contact cup moves the movably mounted electrical contact, with the result that the latter actuates the electrical switching contact, the measuring device being configured to close the two switching devices when the electrical switching contact is actuated.

In various examples and embodiments, this achieves the technical advantage, in particular, that it is possible to efficiently mechanically identify the plugged-in data cable. This is because the fifth contact cup can be moved only when a fifth contact pin is present in order to actuate the electrical switching contact. If the connector of the data cable has only four electrical contact pins, the fifth contact cup cannot be moved, with the result that an electrical switching contact also cannot be actuated in this respect, which in this respect results in the measuring device not closing the two switching devices. This is assuming, in particular, that the connector and the socket are geometrically configured in such a manner that the four electrical contact pins, to which one wire of the two pairs of wires is respectively connected, fit only into the four contact cups of the socket, to the respective electrical contact of which the physical interface is connected or the DC voltage supplies are connected, which is therefore provided according to one embodiment.

Another embodiment provides for the measuring device to be configured to check, via the electrical contact of the fifth contact cup, which differs from the two and the other two of the five contact cups, whether a programmable memory is integrated in the connector as an electrical component and to close the two switching devices on the basis of the check.

In various examples and embodiments, this achieves the technical advantage, in particular, that it is possible to efficiently identify the connected data cable. Absence of an electrical component is then taken as a criterion for not closing the switching devices, for example. Only the presence of the electrical component, that is to say the programmable memory here, results in the switching devices being closed. Providing a programmable memory has the advantage, in particular, that particular operating parameters and/or properties of the data cable can be stored in the memory, which is therefore also provided according to one embodiment. According to one embodiment, these properties are read by means of the measuring device in order to operate the input/output module on the basis of the properties which have been read.

The programmable memory may be, for example, a PROM, that is to say a "Programmable Read Only Memory." In various examples and embodiments, the checking operation comprises, in particular, the measuring device attempting to set up a communication connection to a programmable memory. For this purpose, the measuring device transmits a request, for example, via the electrical contact of the fifth contact cup. If a response to this request is not received by means of the measuring device after a predetermined time, it is assumed that there is no programmable memory in the connector. If a response is received by means of the measuring device within a predetermined time, it is assumed that a memory is integrated in the connector. The switching devices are closed in this respect.

Embodiments of the method and of the data cable and of the bus system result in a similar manner from corresponding embodiments of the input/output module and vice versa. That is to say, technical functionalities of the method and of the data cable and of the bus system similarly result from corresponding functionalities of the input/output module and vice versa.

According to one embodiment, the method also comprises one or more of:
- using the measuring device to apply an electrical measurement voltage between the electrical contact of the fifth contact cup, which differs from the two and the other two of the five contact cups, and an electrical reference contact, and
- using the measuring device to measure whether an electrical current flows between the reference contact and the electrical contact of the fifth contact cup,
- using the measuring device to close the two switching devices when an electrical current flowing between the electrical reference contact and the electrical contact of the fifth contact cup is measured when an electrical measurement voltage is applied.

In another embodiment, the method also comprises: using the measuring device to close the two switching devices if the measuring device detects switching-on of the transistor.

Another embodiment provides for the transistor to directly produce a switching signal for the switching devices on account of the transistor switching on, with the result that the switching devices close in response to the switching signal.

According to another embodiment, the method also comprises: using the measuring device to determine, on the basis of the applied measurement voltage and the measured electrical current, what type of electrical component integrated in the connector has formed an electrical connection between the electrical reference contact and the electrical contact of the fifth contact cup.

According to another embodiment, the method also comprises: using the measuring device to determine an electrical property of the electrical component.

According to another embodiment, the method also comprises: using the measuring device to determine a property of the plugged-in data cable on the basis of the applied measurement voltage and the measured electrical current.

In another embodiment, the method also comprises: using the measuring device to close the two switching devices if the electrical switching contact is actuated.

According to another embodiment, the method also comprises one or more of:

using the measuring device to check, via the electrical contact of the fifth contact cup, which differs from the two and the other two of the five contact cups, whether a programmable memory is integrated in the connector as an electrical component, using the measuring device to close the two switching devices on the basis of the check.

In another embodiment, the data cable comprises a shield, at least one electrical component being connected between the fifth electrical contact pin and the shield.

In the plugged state, the shield may preferably be electrically connected to the electrical reference contact. The electrical reference contact is ground, for example.

According to one embodiment, the at least one electrical component is selected from the following group of electrical components: resistor, inductance, capacitor, diode, programmable memory.

The wording "at least one electrical component" comprises the case of one or a plurality of electrical components, in particular. Provision is therefore made, for example, for a plurality of electrical components to be connected between the shield and the fifth electrical contact pin. For example, an LC circuit or an RC circuit or an RLC circuit is constructed between the shield and the fifth electrical contact pin. L represents an inductance, R represents an electrical resistor (also called a non-reactive resistor) and C represents a capacitor. An LC circuit therefore comprises an inductance and a capacitor. An RC circuit comprises a resistor and a capacitor. An RLC circuit comprises a resistor, an inductance and a capacitor.

Another embodiment provides for a property of the data cable to be stored in the programmable memory. According to one embodiment, the data cable comprises two connectors each with five electrical contact pins, one of four of the five electrical contact pins respectively being electrically connected to one of the wires of the two pairs of wires in each case.

The two connectors may preferably be arranged at opposite ends of the data cable. The data cable can therefore be plugged into a further socket of a further input/output module.

According to one embodiment, the two pairs of wires are each configured as a twisted pair of wires. This achieves the technical advantage, in particular, that it is possible to achieve efficient protection against external alternating magnetic fields and electrostatic influences.

Another embodiment provides for all four wires of the two pairs of wires to be twisted together. This achieves the technical advantage, in particular, that the data cable has a high degree of flexibility.

The data cable can also be referred to as a data line. Since the data cable and the data line comprise four wires, the data cable may also be referred to as a four-wire data cable and the data line may also be referred to as a four-wire data line.

One of the two pairs of wires forms a first channel according to one embodiment. The other one of the two pairs of wires forms a second channel according to one embodiment. This therefore advantageously means that two-channel communication can be achieved between two input/output modules which are connected to one another via the data cable.

BRIEF DESCRIPTION OF THE DRAWINGS

Various examples of the invention are explained in greater detail below on the basis of preferred exemplary embodiments and with reference to the figures, in which:

FIG. 2 shows a connector/socket arrangement.

FIG. 3 shows a further connector/socket arrangement.

The same reference symbols can be used for the same or similar features below. Furthermore, for the sake of clarity, provision is made for not all features to always be depicted in all drawings. A placeholder in the form of a geometric object is sometimes used for a group of features, for example.

DETAILED DESCRIPTION

Figure 1:
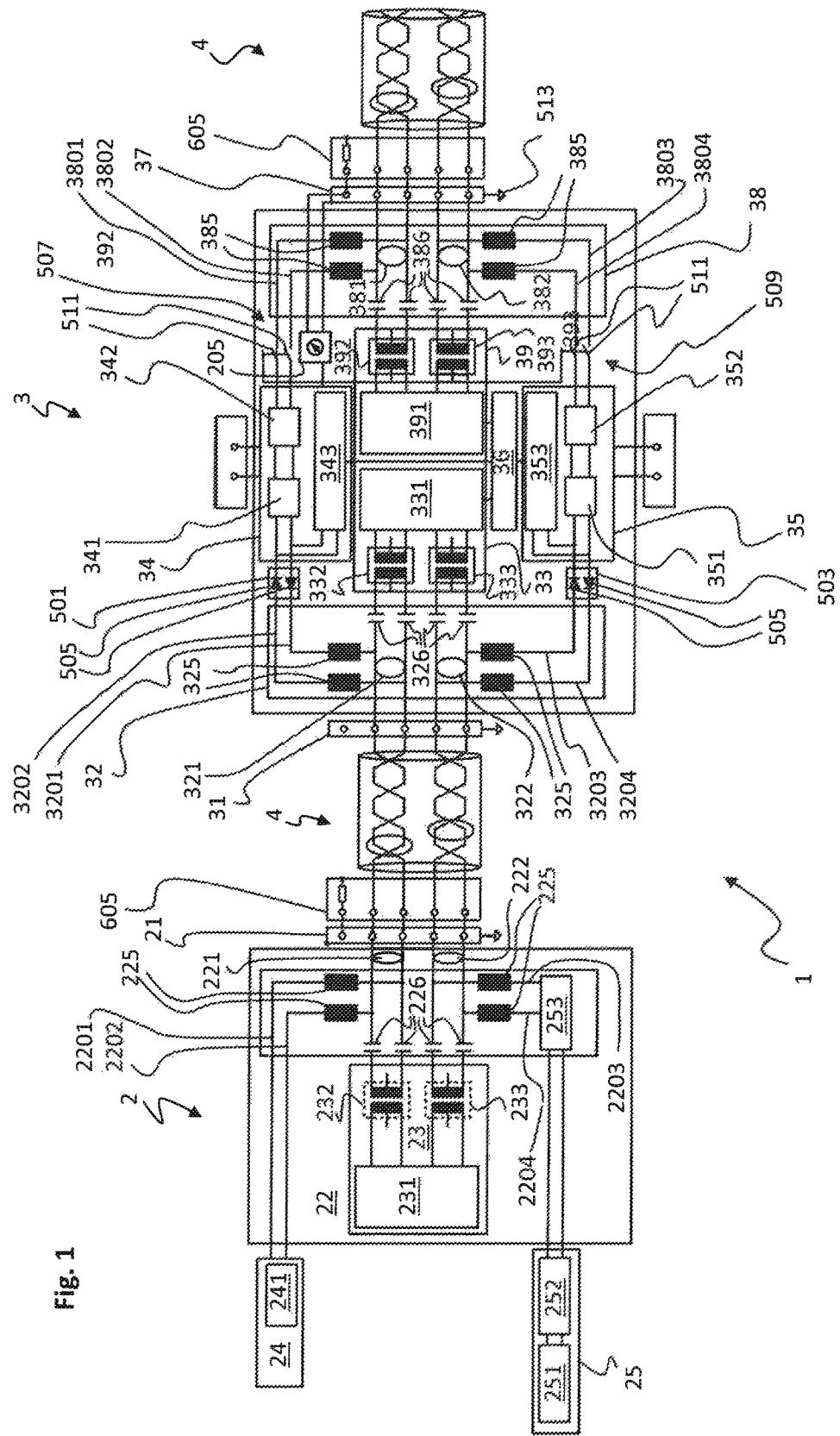
FIG. 1 shows a bus system.

FIG. 1 shows a schematic illustration of a bus system 1 having a supply module 2 and a consumer module 3 which are connected to one another via a data cable 4, the data cable 4 also being able to be referred to as a data line.

The consumer module 3 is configured as an input/output module according to one embodiment of the present invention, which is explained further below. For the sake of simplicity, the input/output module is also referred to as a consumer module 3 below.

The data cable or the data line 4 comprises four wires 401, 402, 403, 404, two wires in each case forming a twisted pair of wires 41, 42. Another embodiment provides for all four wires to be twisted together, which, although resulting in disadvantages in terms of the electromagnetic compatibility, has the advantage of a higher degree of flexibility of the line.

The supply module 2 and the consumer module 3, that is to say the input/output module, each have a contact point 21, 31 which connects the data line 4 to the supply module 1 and the consumer module 3. The contact point 21 of the supply module 2 and the contact point 31 of the consumer module 3 each comprise five connections, four of the five connections respectively being provided for each wire of the data line 4. The contact point 21 of the supply module 2 or the contact point 31 of the consumer module is configured as a socket which is not illustrated in any more detail, the five connections each being configured as a contact cup having an electrical contact. The contact points 21, 31 are therefore configured as plug contacts which are connected to the two twisted pairs of wires 41, 42 via corresponding mating parts on the data line 4.

For this purpose, the data cable 4 or the data line 4 has a connector which matches the sockets and has five electrical contact pins. One of the four wires is respectively connected to four of the respective five electrical contact pins.

The sockets are configured, for example, according to the RJ45 standard, that is to say are RJ45 sockets. The sockets are configured as M8 sockets, for example.

The connectors are configured, for example, according to the RJ45 standard, that is to say are RJ45 connectors. The connectors are configured as M8 connectors, for example. Therefore, one connector and one socket form an M8 plug connection, for example.

Furthermore, a sensor and controller supply 24 and an actuator supply 25 are provided and are connected to the supply module 2.

The supply module 2 also comprises a coupler unit 22 and a data transmission unit 23. The coupler unit 22 is composed of four line sections 2201, 2202, 2203, 2204 which are each connected to a connection of the contact point 21 and have a first branch and a second branch. An inductance 225 is arranged in the first branch of each line section 2201, 2202, 2203, 2204 and a capacitance 226 is arranged in the second branch. Two line sections 2201, 2202, 2203, 2204 of the coupler unit 22 respectively form a pair of line sections 221, 222 which is assigned to a corresponding pair of wires 41, 42 of the data line 4.

The first branches of the two pairs of line sections 221, 222 with the inductances 225 form first clamping points and the second branches of the two pairs of line sections 221, 222 with the capacitances 226 form second clamping points. The first clamping points of the first branch of the first pair of line sections 221 are connected to the sensor and controller supply 24 which has a power supply unit 241 for impressing a first DC voltage. The first clamping points of the first branch of the second pair of line sections 222 are connected, via a current limiter 253, to the actuator supply 25 which impresses a second DC voltage, the actuator supply 25 having a power supply unit 251 and a switch 252. The two second clamping points of the two second branches of the two pairs of line sections 221, 222 are connected to the data transmission unit 23 via the capacitances 226 in order to transmit a first and a second differential data signal.

The data transmission unit 23 has a so-called Ethernet physical layer 231 which forms a physical interface between the supply module 2 and a downstream processing unit and codes and decodes data. The Ethernet physical layer 231 provides the first and second differential data signals. The first differential data signal is transmitted from and to the two second clamping points of the second branch of the first pair of line sections 221 via a first transformer 232. The second differential data signal is applied to the two second clamping points of the second branch of the second pair of line sections 222 and is received from there via a second transformer 233.

The supply module 2 therefore makes it possible to transmit both a DC voltage and a differential data signal in an associated pair of wires 41, 42 of the data line 4 via a respective pair of line sections 221, 222 of the coupler unit 22. The first pair of line sections 221 of the coupler unit 22 in the supply module 2 applies the first DC voltage to the first pair of wires 41 of the data line 4 via the contact point 21 and simultaneously transmits the first differential data signal. The second pair of line sections 222 of the coupler unit 22 in the supply module 2 injects the second DC voltage into the second pair of wires 42 of the data line 4 in a parallel manner via the coupling point 21 and simultaneously transmits the second differential data signal.

The two differential data signals and the two DC voltages are isolated from one another by the inductance 225 arranged in the first branch of each line section 2201, 2202, 2203, 2204 and the capacitance 226 arranged in the second branch of each line section 2201, 2202, 2203, 2204. In this case, the capacitances 226 largely block the DC voltages in the first branches, whereas the inductances 225 substantially suppress the differential data signals in the second branches. In this case, the inductances and the capacitances are designed in such a manner that sufficiently strong attenuation of the differential data signals is carried out in the first branch but low frequencies may also simultaneously occur in the second branch of the pair of line sections, which frequencies result, for example, from use of an auto-negation method or the baseline wander effect.

In the consumer module 3, the contact point 31 is followed by an arrangement which is complementary to the supply module and is composed of a coupler unit 32, a data transmission unit 33, a sensor and controller supply 34 and an actuator supply 35. The coupler unit 32 is composed of four line sections 3201, 3202, 3203, 3204 which are each connected to a connection of the contact point 31 and have a first and a second branch. An inductance 325 is again arranged in the first branch of each line section 3201, 3202, 3203, 3204 and a capacitance 326 is arranged in the second branch. Two line sections 3201, 3202, 3203, 3204 of the coupler unit 32 respectively form a pair of line sections 321, 322 which is assigned to a corresponding pair of wires 41, 42 of the data line 4.

The first branches of the two pairs of line sections 321, 322 with the inductances 325 form first clamping points and the second branches of the two pairs of line sections 321, 322 with the capacitances 326 form second clamping points. The first clamping points of the first branch of the first pair of line sections 321 are connected to the sensor and controller supply 34 in order to be supplied with the first direct current transmitted from the supply module 2 on the first pair of wires 41 of the data line 4. The first clamping points of the first branch of the second pair of line sections 322 are connected to the actuator supply 35 in order to be supplied with the second direct current transmitted from the supply module 2 on the second pair of wires 42 of the data line 4.

Apart from the voltage losses caused by the transmission path and the interposed components, the first DC voltage which is impressed into the supply module 2 by the sensor and energy supply 24 is therefore applied to the sensor and controller supply 34 in the consumer module 3. In contrast, the actuator supply 35 in the consumer module 3 is supplied, taking into account the voltage losses during transmission and caused by the interposed components, with the second DC voltage which is applied to the supply module 2 by the actuator supply 25.

As shown in FIG. 1, the sensor and controller supply 34 and the actuator supply 35 in the consumer module 3, each connected upstream of a load 342, 352, may have a blocking unit 341, 351. The blocking unit 341, 351 prevents feedback of the direct current from the load 342 in the sensor and controller supply 34 or the load 352 in the actuator supply 35 in the consumer module 3 to the power supply unit 241 in the sensor and controller supply 24 or to the power supply unit 251 in the actuator supply 25 in the supply module 2.

Feedback protection 501, 503 is respectively connected upstream of the sensor and controller supply 34 and the actuator supply 35. The feedback protection 501, 503 respectively comprises two diodes 505 which are connected into the line sections 3201, 3202, 3203, 3204. Instead of the diodes 505, another embodiment provides for FETs (field effect transistors) to be used. In contrast with diodes, FETs have lower losses with the same function.

The diode 505 in the line section 3201 blocks a flow of current from the contact point 31 in the direction of the sensor and controller supply 34. The diode 505 in the line section 3202 blocks a flow of current from the sensor and controller supply 34 in the direction of the contact point 31. The diode 505 in the line section 3203 blocks a flow of current from the actuator supply 35 in the direction of the contact point 31. The diode 505 in the line section 3204 blocks a flow of current from the contact point 31 in the direction of the actuator supply 35.

The feedback protection 501, 503 is optional. Said feedback protection is not provided in one embodiment.

The two second clamping points of the two second branches of the two pairs of line sections 321, 322 are connected to a data transmission unit 33 in order to receive the first and second differential data signals transmitted by the supply module 2 and to transmit the first and second differential data signals to the supply module 2. For this purpose, in a similar manner to the data transmission unit 23 in the supply module 2, the data transmission unit 33 has a so-called Ethernet physical layer 331 which forms a physical interface between the consumer module 3 and a downstream processing unit 36 and codes and decodes data. The Ethernet physical layer 331 receives and transmits the first differential data signal via a first transformer 332 which is connected to the two second clamping points of the second branch of the first pair of line sections 321. The second differential data signal is via a second transformer 333 which is connected to or from the two second clamping points of the second branch of the second pair of line sections 322.

This structure therefore makes it possible to transmit a DC voltage and a differential data signal in a parallel manner via two respective, e.g., preferably twisted wires in the data line 4 between the supply module 2 and the consumer module 3, the two DC voltages being DC-isolated from one another.

In order to use the bus system 1 in industrial automation, it is necessary to configure the energy supply for the actuators in the bus system to be switchable via the second (twisted) pair of wires 42 in the data line 4. The actuator supply 25 therefore comprises the switch 252 which is arranged downstream of the power supply unit 251 and makes it possible to disconnect the actuator supply 25 independently of the sensor and controller supply 24. Disconnecting the actuator supply 25 makes it possible to change the actuators in the automation network to a safe state without having to interrupt communication. The sensors and the controller are still provided with the first direct current from the sensor and controller supply 24 in the supply module 2 and can be addressed using the first and second differential data signals.

According to one embodiment, the switch 252 of the actuator supply 25 is configured as a low-bounce switch in order to prevent the switch from repeatedly closing and opening during actuation on account of the mechanical structure. Such repeated closing and opening results in increased contact abrasion and therefore in rapid failure, in particular when high overcurrents occur at the same time. An RS flip-flop, for example, can be used as the low-bounce switch.

In order to prevent switching operations of the actuator supply 25 from disrupting data communication via the second twisted pair of wires 42, the current limiter 253 is integrated in the supply module 2 and is connected to the switch 252 of the actuator supply 25. The current limiter 253 can be used to prevent a high start-up current of the downstream consumer module, which occurs for a short time during the switch-on operation, from exceeding the permissible saturation current of the inductances 225 in the first branches of the second pair of line sections 222 and the inductances 225 virtually completely losing their inductive properties. This would then result in the differential data signal on the second branches of the second pair of line sections 222 being severely influenced and communication via the second twisted pair of wires 42 in the data line 4 collapsing.

In addition to limiting the start-up current, the current limiter 253 can also ensure that the maximum continuous current through the inductances 225 in the first branches of the second pair of line sections 222 is limited provided that its thermal loading allows this. The maximum permissible continuous current through the inductances 225 is determined by their non-reactive resistance and the thermal properties. If the maximum permissible continuous current is permanently exceeded, the inductances 225 lose their inductive properties and can be destroyed. The use of a current limiter is generally required only in the supply module 2.

In the consumer module 3 shown in FIG. 1, that is to say the input/output module, both the sensor and controller supply 34 and the actuator supply 35 have a voltage monitoring unit 343, 353 respectively clamped to the two lead-throughs in the sensor and controller supply 34 and the actuator supply 35. The two voltage monitoring units 343, 353 can be used to monitor whether both the sensor and controller supply 34 and the actuator supply 35 in the consumer module 3 are each operating in the specified range of the operating voltage.

In the case of the structure shown in FIG. 1, one embodiment provides for the supply module 2 to supply a number of consumer modules which are connected in series and correspond to the consumer module 3 shown in FIG. 1. As illustrated in FIG. 1, the consumer module 3 is constructed in a substantially symmetrical manner in order to transmit the two direct currents provided by the supply module 2 on the two twisted pairs of wires 41, 42 of the data line 4 and the two differential data signals to a further consumer module. In this case, the further consumer module is in turn connected to a second contact point 37 of the consumer module 3 via a data line having four wires, two wires respectively forming a twisted pair of wires. The second contact point 37 is formed in a similar manner to the contact point 31.

The consumer module 3 has a second coupler unit 38 which is designed in a complementary manner to the first coupler unit 32. The second coupler unit 38 is composed of four line sections 3801, 3802, 3803, 3804 which are each connected to a connection (an electrical contact of four contact cups) of the second contact point 37 and have a first and a second branch. An inductance 385 is again arranged in the first branch of each line section 3801, 3802, 3803, 3804 and a capacitance 386 is arranged in the second branch. Two line sections 3801, 3802, 3803, 3804 of the coupler unit 38 respectively form a pair of line sections 381, 382 which is assigned to a corresponding pair of wires of the data line 4 which can be connected via the second contact point 37.

The first branches of the two pairs of line sections 381, 382 with the inductances 385 form first clamping points and the second branches of the two pairs of line sections 381, 382 with the capacitances 386 form second clamping points. The first clamping points of the first branch of the first pair of line sections 221 are connected to the sensor and controller supply 34 in order to apply the first DC voltage and to therefore transmit the first direct current provided by the supply module 2 to a sensor and controller supply of the next consumer module via the two pairs of line sections 381, 382. The first clamping points of the first branch of the second pair of line sections 222 are connected to the actuator supply 35 which impresses the second DC voltage. The second direct current provided by the supply module 2 is therefore forwarded to an actuator supply of the next consumer module via the pair of line sections 382.

The two second clamping points of the two second branches of the two pairs of line sections 381, 382 are connected to a second data transmission unit 39 which transmits the first and second differential data signals. For this purpose, in a similar manner to the first data transmission unit 33 in the consumer module 3, the second data transmission unit 39 has a so-called Ethernet physical layer 391 which constitutes a physical interface to the processing unit 36 and codes and decodes data. The Ethernet physical layer 391 transmits and receives the first differential data signal via a first transformer 392 which is connected to the two second clamping points of the second branch of the first pair of line sections 381. The second differential data signal is transmitted from and to the Ethernet physical layer 391 via a second transformer 393 which is connected to the two second clamping points of the second branch of the second pair of line sections 382.

The Ethernet physical layer 331 of the first transmission unit 33 is connected to the Ethernet physical layer 391 of the second transmission unit 39 via the interposed processing device 36 in the consumer module 3. The two differential data signals can therefore be transmitted from the first Ethernet physical layer 331 to the second Ethernet physical layer 391 and back after processing by the interposed processing device 36 and can therefore be looped through the consumer module 3 and can be transmitted to and from a data transmission unit of the next consumer module.

Coupler units having a combination of inductive and capacitive subassemblies are respectively used in the supply module 2 and the consumer modules 3 of the bus system 1 in order to apply two DC-isolated DC voltages to a four-wire data line. Two DC-isolated direct currents can be transmitted in a parallel manner, in addition to two differential data signals, on the two pairs of wires of the data line using only an individual cabling system consisting of the four-wire data line. The functionality of the bus system is not changed with regard to the transmission of data.

When using the Ethernet transmission physics, the design of the capacitances in the pair of line sections of the coupler unit is determined by the lower cut-off frequency of the differential data signal to be transmitted, which lower cut-off frequency is in turn predefined by the auto-negotiation process. This cut-off frequency is at approximately 2 MHz. The capacitances must then be designed in such a manner that they do not yet reach saturation at this cut-off frequency, with the result that capacitances of 470 nF are required. In this case, an embodiment having capacitances of 1 µF may be preferred in order to compensate for possible effects of a fluctuating supply voltage.

When designing the inductances of the coupler unit, in particular in the consumer module, it is decisive whether the two DC voltages are conducted, as shown in FIG. 1, with the result that the inductances of the two coupler units in the consumer module are connected to one another. As a result, the two differential data signals are also coupled. The inductances of the coupler units must then be selected in such a manner that crosstalk is prevented. In addition, the properties of the Ethernet physical layer in the data transmission unit are also important for the design of the inductances. In one embodiment, an inductance of greater than 3 µH, e.g., preferably 6.8 µH, is used.

The input/output module 3, that is to say the consumer module 3, also has a first switching device 507 and a second switching device 509. Both switching devices 507, 509 each comprise two switches 511 which are each connected in one of the four line sections 3801, 3802, 3803, 3804 between the sensor and controller supply 34 or the actuator supply 35 and the electrical contacts of the contact cups of the contact point 37 configured as a socket. That is to say, each of the four line sections 3801, 3802, 3803, 3804 comprises a switch 511. As a result, an electrical connection between the sensor and controller supply 34 or the actuator supply 35 and the contacts of the contact cups can be advantageously interrupted or closed.

The switches 511 are, for example, configured as mechanical switches. For example, the switches 511 are configured as electrical switches, for example as a transistor.

The input/output module 3 also comprises a measuring device 205. The measuring device 205 is configured to open or close the switching devices 507, 509. That is to say, the measuring device 205 is configured to open or close the switches 511.

The measuring device 205 is also configured to apply a measurement voltage between an electrical contact of the fifth contact cup and an electrical reference contact 513. For the sake of clarity and for the further description, the five contact cups are symbolically illustrated as a circle and are consecutively numbered with the reference symbols 515, 517, 519, 521, 523.

The line section 3803 leads to the electrical contact of the contact cup 517. The line section 3804 leads to the electrical contact of the contact cup 515. The line section 3802 leads to the electrical contact of the contact cup 521. The line section 3801 leads to the electrical contact of the contact cup 519.

The measurement voltage is applied to the electrical contact of the fifth contact cup, that is to say of the contact cup 523, and to the electrical reference contact 513. The electrical reference contact 513 is connected to ground, for example.

In the arrangement shown in FIG. 1, the electrical contact of the contact cup 515 is likewise connected to the electrical reference contact 513, that is to say to ground, for example. In embodiments, provision is made for an electrical contact of another one of the four contact cups 515, 517, 519, 521 to be connected to the electrical reference contact 513, that is to say to ground, for example.

Provision is made of a data cable which is plugged into the socket 37 and is likewise indicated with the reference symbol 4. This data cable is configured in a similar manner to the data cable 4 between the supply module 2 and the consumer module 3. It comprises an electrical resistor 525 which is integrated in the contact point 605 configured as a connector and is connected between the fifth contact pin 529 and a shield 527 of the data cable 4. The fifth contact pin is that contact pin to which none of the four wires is connected.

If the connector 605 of the data cable is inserted into the socket 37, the four contact cups 515, 517, 519, 521 each accommodate a corresponding contact pin. The fifth contact cup 523 accommodates the fifth contact pin 529. In the inserted state, the shield 527 is connected to the electrical reference contact 513. An electrical connection is therefore formed between the reference contact 513 and the electrical contact of the fifth contact cup 523 via the electrical resistor 525.

For the sake of simplicity, the further four electrical contact pins of the connector 605 are indicated using the same reference symbol, the reference symbol 531.

On account of the applied measurement voltage, an electrical current flows between the reference contact 513 and the electrical contact of the fifth contact cup 523. The measuring device 205 measures this electrical current and thereby recognizes that the connected data cable 4 must have five electrical contact pins. For the measuring device 205, this means that the input/output module connected downstream of the input/output module 3 shown in FIG. 1 is configured to receive not only the data signals but also the DC voltages via the four wires (PoE functionality). Therefore, the measuring device 205 closes the four switches 511. The supply voltages can therefore be advantageously forwarded to the next subscriber, the further input/output module.

If the downstream input/output module were not configured for a PoE functionality, that is to say must not receive a supply voltage via the four wires, a data cable having only four electrical contact pins for the four wires would be used in this case. In this case, in the plugged state, an electrical connection would then not be formed between the reference contact 513 and the electrical contact of the fifth contact cup 523. No electrical current therefore flows. The measuring device 513 therefore does not measure an electrical current. For the measuring device 205, this means that it must not close the switches 511.

According to an embodiment, the input/output module shown in FIG. 1 is also disclosed per se, that is to say separated from the bus system 1. The same applies to the data cable 4 comprising the electrical resistor 525.

In another embodiment, provision is made for the supply module 2 to comprise a measuring device and two switching devices in a similar manner to the input/output module 3. In a similar manner, these switching devices each comprise, for example, two switches which are connected in the line sections 2201, 2202, 2203, 2204. According to one embodiment, provision may preferably be made for the data cable 4 which connects the supply module 2 and the input/output module 3 to be configured in a similar manner to the data cable 4 which is connected to the contact point 37 of the input/output module 3.

The consumer module 3 is therefore configured as an input/output module for a bus system 1, comprising a first DC voltage supply, the sensor and controller supply 34 and a second voltage supply, the actuator supply 35. The input/output module 3 also comprises a physical interface 391, a first transformer 392, a second transformer 393, and first and second inductive subassemblies, the inductances 385. The input/output module 3 also comprises a first switching device 507 and a second switching device 509.

The input/output module 3 also comprises a socket, the contact point 37 configured as a socket. The socket 37 comprises five contact cups each comprising an electrical contact 515, 517, 519, 521, 523. The two DC voltage supplies can be electrically connected respectively to corresponding electrical contacts of the five contact cups via the two switching devices 509, 507.

Figure 1B:
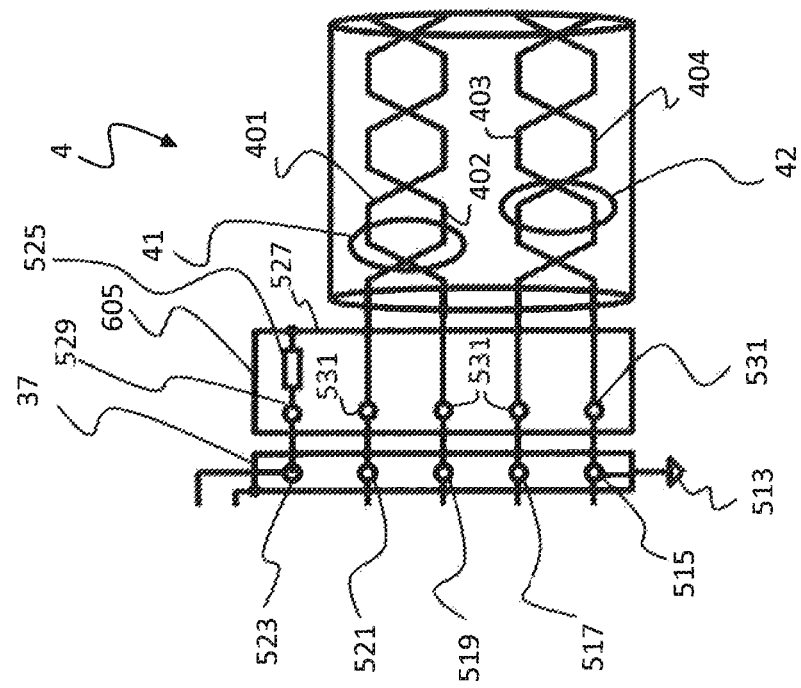
FIGS. 1a and 1b each show a section of the bus system from FIG. 1.
Figure 1A:
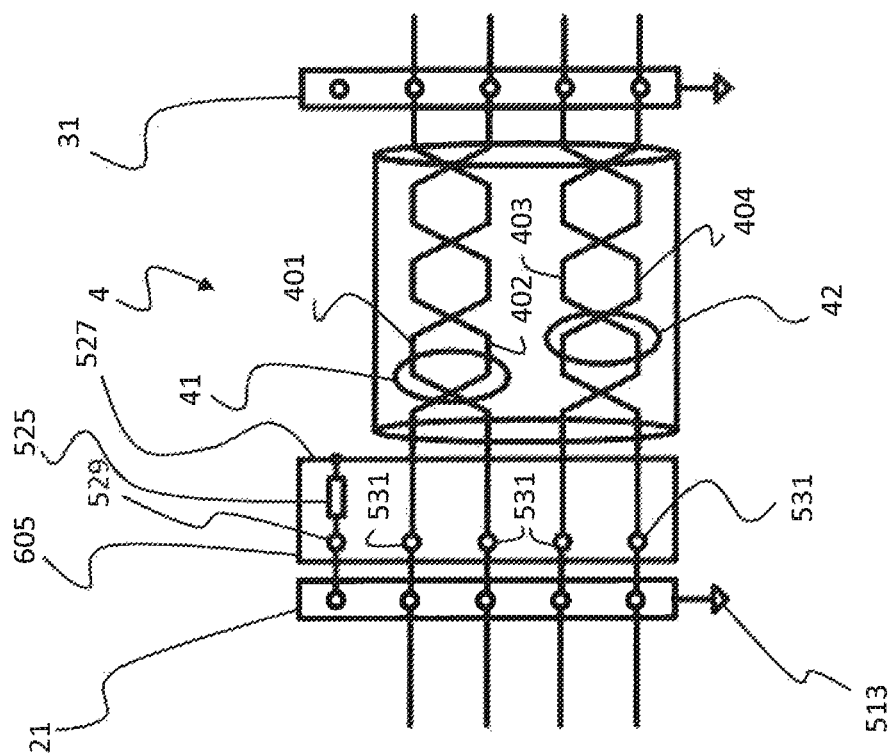

For better clarity, FIGS. 1*a* and 1*b* each show a section of the arrangement shown in FIG. 1. FIG. 2 shows a connector/socket arrangement in a simplified side view.

The arrangement shown in FIG. 2 comprises a socket 601 and a connector 605 of a data cable 603. The data cable 603 comprises four wires 607, 609, 611, 613. The two wires 607, 611 form a first pair of wires. The wires 609, 613 form a second pair of wires. The first pair of wires can form a first channel and the second pair of wires can form a second channel in order to respectively transmit first and second differential data signals.

The connector 605 comprises five electrical contact pins 615, 617, 619, 621, 623. The wire 607 is connected to the electrical contact pin 615. The wire 609 is connected to the electrical contact pin 617. The wire 611 is connected to the electrical contact pin 621. The wire 613 is connected to the electrical contact pin 623. That is to say, no wire is connected to the fifth contact pin 619.

The data cable 603 is a shielded data cable, with the result that the data cable 603 in this respect comprises a shield 625 which is electrically connected to an outer housing 629 of the connector 605 via an electrical connection 627. That is to say, if the outer housing 629 is connected to ground, the shield 625 is then also connected to ground.

Although it might seem from the drawing that the four wires 607, 609, 611, 613 are likewise connected to the shield 625, they run inside the shield 625, that is to say are not electrically connected to the latter.

The socket 601 comprises five contact cups 631, 633, 635, 637, 639 which are configured to accommodate the five contact pins 615, 617, 619, 621, 623. Each of the five contact cups 631, 633, 635, 637, 639 comprises an electrical contact 641. In the plugged state, the electrical contact pins 615, 617, 619, 621, 623 therefore make contact with the contacts 641.

The contacts 641 of the two contact cups 637, 639 are connected to an actuator supply and to a physical interface via corresponding line sections in a similar manner to the arrangement shown in FIG. 1. This is described here for the sake of clarity.

The contacts 641 of the two contact cups 631, 633 are likewise connected to a sensor/control supply and to the physical interface via corresponding line sections in a similar manner to the arrangement shown in FIG. 1. This is also described here for the sake of clarity.

The arrangement of the contact cups and of the electrical contact pins is such that, in the plugged state, the electrical contact pins 615, 617 are accommodated in the contact cups 631, 633. The electrical contact pins 621, 623 are accommodated in the contact cups 637, 639.

The contact pin 619 is accommodated in the contact cup 635. The contact cup 635 comprises an elastic contact cup section 643 which is deflected from its position of rest by the insertion of the contact pin 619. This deflection is upward based on the paper plane of FIG. 2. A switching contact 645 is provided above the contact cup section 643, with which contact is made via an electrical contact 647. If the contact cup section 643 moves upward in the direction of the switching contact 645 on account of the insertion of the contact pin 619 into the contact cup 635, the contact cup section 643 will then make contact with said switching contact. Since the contact cup section 643 is configured to be electrically conductive and is electrically connected to the contact 641, an electrical current flows if an electrical voltage is applied to the contacts 647, 641, which is thus provided according to one embodiment. This electrical current can be measured and is an indication of the fact that the data cable 603 comprises a fifth contact pin. In this respect, the switching devices of the input/output module can be closed. This is carried out in a similar manner to the statements made in connection with FIG. 1.

If a data cable which does not comprise a fifth contact pin 619 is used, the switching contact 645 is not actuated by means of the contact cup section 643. In this case, an electrical current does not flow when a voltage is applied. This is an indication of the fact that the switching devices must remain open and must not be closed.

FIG. 3 shows a further connector/socket arrangement. The arrangement shown in FIG. 3 is constructed in a substantially similar manner to the arrangement shown in FIG. 2. Accordingly, reference is made to the relevant statements. As a difference, a switching contact 645 comprising an electrical contact 647 is not provided. In particular, the contact cup 635 does not comprise an elastic electrically conductive contact cup section 643. Rather, in FIG. 3, provision is made for the connector 605 of the arrangement shown in FIG. 3 to comprise an electrical resistor 701 which connects the electrical contact pin 619 to the outer housing 629, that is to say to the shield 625.

In the plugged state, an electrical connection is therefore formed between the electrical contact 641 of the contact cup 635 and the electrical reference contact since, in the plugged state, the shield of the data cable 603 makes contact with the electrical reference contact, generally ground. If a voltage is now applied, an electrical current then also flows here in a similar manner to FIG. 2, which current can be measured. This is an indication of the fact that the switching devices need to be closed. If a fifth contact pin 619 is not provided, a current does not flow when an electrical voltage is applied. This is an indication of the fact that the switching devices need to be left open or should not be closed.

The current profile which is measured depends, in particular, on the kind or type of the electrical component which is used and connects ground or the shield of the data cable 603 to the fifth electrical contact pin 619. If a capacitor, for example, were provided instead of the electrical resistor 701, a different current profile would be measured. If a coil, for example, were provided instead of the resistor 701, a different electrical current profile would be measured. It is therefore possible to determine which electrical component is involved on the basis of a measured current profile. In particular, properties of the electrical components used can be determined using the measured current profile. Such properties are, for example, an inductance value for an inductance, a capacitance value for a capacitor or a resistance value for a resistor.

Provision is made, for example, for different electrical properties of the electrical components used to code a data cable length. In particular, these properties may code operating parameters of the input/output module.

In the case of the connectors shown in FIGS. 2 and 3, it is therefore possible to advantageously identify which data cable is plugged, with the result that it is possible to decide whether or not a supply voltage is intended to be forwarded to the remote subscriber.

Figure 4:
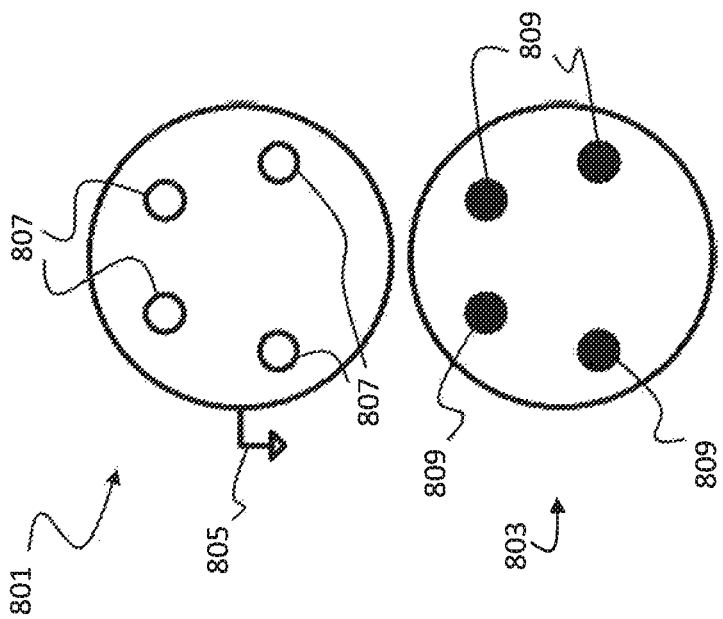
FIG. 4 shows another connector/socket arrangement.

FIG. 4 shows another connector/socket arrangement in a simplified sectional view. FIG. 4 shows a socket 801 comprising four contact cups 807. The housing of the socket 801 is connected to ground 805, generally to an electrical reference contact. The electrical contacts of the contact cups 807 are described here for the sake of clarity.

A connector 803 which is complementary to the socket 801 comprises four electrical contact pins 809 in this respect.

Figure 5:
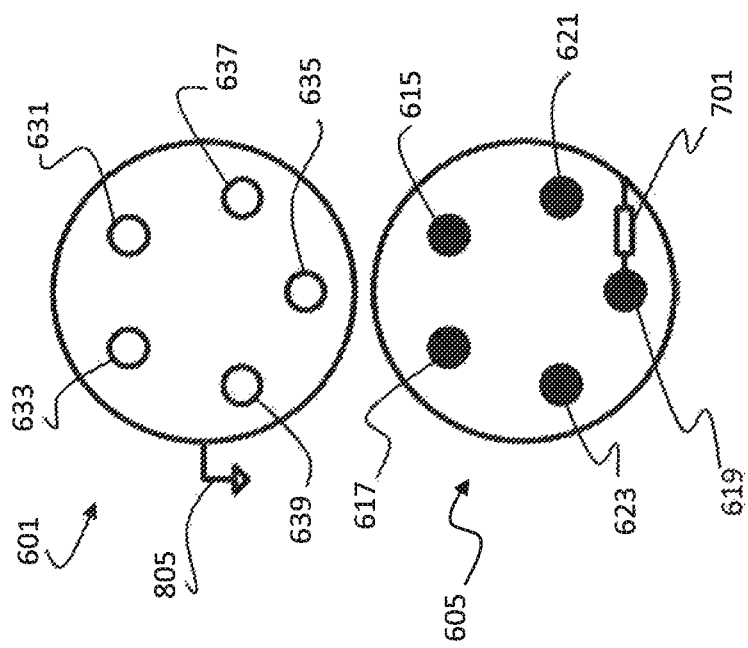
FIG. 5 shows the connector/socket arrangement from FIG. 3 in a different view.

FIG. 5 shows the socket/connector arrangement shown in FIG. 3 in a simplified further view from the front. The respective arrangement of the contact cups and of the contact pins with respect to one another is such that the contact cups can accommodate the contact pins. The arrangement of the contact cups is also such that they can accommodate the contact pins 809 of the connector 803 from FIG. 4.

That is to say, the connector 803 from FIG. 4 fits into the socket 601 from FIG. 5. However, on account of the absence of the fifth contact pin and the absence of the electrical resistor 701, an electrical current will not be measured when a corresponding measurement voltage is applied. It is therefore possible to detect that the connector plugged into the socket 601 is a connector having four contact pins and is not a connector having five contact pins. This is then an indication of the fact that the supply voltage must not be made available to the remote subscriber connected to the data cable. The connector 605 according to the arrangement shown in FIG. 5 cannot be plugged into the socket 801 according to FIG. 4 on account of the fifth contact pin 619. If a connector comprising five contact pins is therefore referred to as the new connector and, in this respect, the socket comprising five contact cups is referred to as the new socket and if, in this respect, a connector comprising only four contact pins is referred to as the old connector and if, in this respect, a socket comprising only four contact cups is referred to as the old socket, the old connector fits into the new socket. However, the new connector does not fit into the old socket, but rather only into the new socket.

The measuring method which is used to decide whether or not the supply voltage can be made available to the remote subscriber should be matched, in particular, to the electrical component which connects the fifth contact pin to the shield.

If an electrical resistor is provided according to one embodiment, provision is made, in particular, for a corresponding measurement voltage to be applied and for the resulting current to be measured. According to one embodiment, the current is measured by means of an individual transistor which switches on when an electrical resistor is present and therefore amplifies the measured current to form a switching signal for the switching devices. For example, provision is made for different values for the electrical resistor, that is to say resistance values, to be recognized by means of an ADC, with the result that further information, for example a line length, can be advantageously coded using said values. According to one embodiment, the resistor is configured as a conductor bridge. The abbreviation "ADC" stands for "analog-to-digital converter." This can be translated with "analog/digital converter" or simply only "A/D converter."

If a complex AC impedance in the form of an inductance L or a capacitance C is provided as the electrical component according to one embodiment, the following two measuring methods can be used, for example.

According to a first embodiment, provision is made for a DC voltage to be connected and for the dynamic current flow to be measured or observed via the ADC at the switch-on moment, with the result that the electrical component can be identified as the inductance L or the capacitance C via the current profile. Depending on the accuracy of the ADC used, different values for L or C can also be determined, with the result that further information can also be coded here.

According to a second embodiment, a defined AC voltage is connected and the dynamic current profile is measured by the electrical component. R, L and C can be identified by determining the phase shift of the current and voltage by means of the component.

If active two-terminal networks, for example diodes, are used as electrical components in another embodiment, connection of an AC voltage and measurement or observation of the resulting current flow are provided, in particular, according to one embodiment in order to be able to detect the fifth contact pin.

Figure 6:
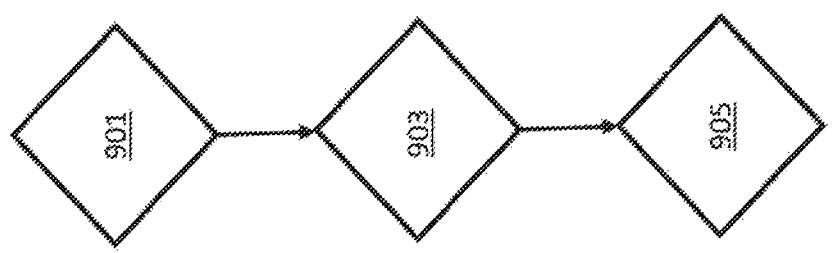
FIG. 6 shows a flowchart of a method for operating an input/output module.

FIG. 6 shows a flowchart of a method for operating an input/output module. The input/output module is the input/output module 3 according to FIG. 1, for example.

The method comprises one or more of the following steps of:
  using the measuring device to detect, when a connector is inserted into the socket, whether the connector comprises four or five electrical contact pins which are each plugged into one of the contact cups and are electrically connected to the respective electrical contact of the contact cups,
  using the measuring device to close the two switching devices only when five electrical contact pins are detected, with the result that a respective supply voltage of the two DC voltage supplies is applied to the corresponding plugged contact pins of the connector plugged into the socket via the respective electrical contacts of the contact cups on account of the closed switching devices.

Various field bus protocols on Ethernet with a data rate of 100 Mbit/s have become established in automation. Since Ethernet with a data rate of 1 Gbit/s has become prevalent in the meantime in the consumer sector, it is useful to also transmit field bus protocols at a data rate of 1 Gbit/s or 10 Gbit/s.

In contrast to the consumer sector in which few subscribers transmit large quantities of data, many subscribers with few data items must communicate with one another in field bus technology. The transit time of an Ethernet message in standard Gbit technology between two subscribers is approximately 1 μs, which corresponds to the transmission time of 1000 bits.

On account of the larger number of subscribers in field bus technology which are generally connected to one another in a line, the transit time of a message from the transmitter to the receiver plays a considerably greater role.

Figure 7:
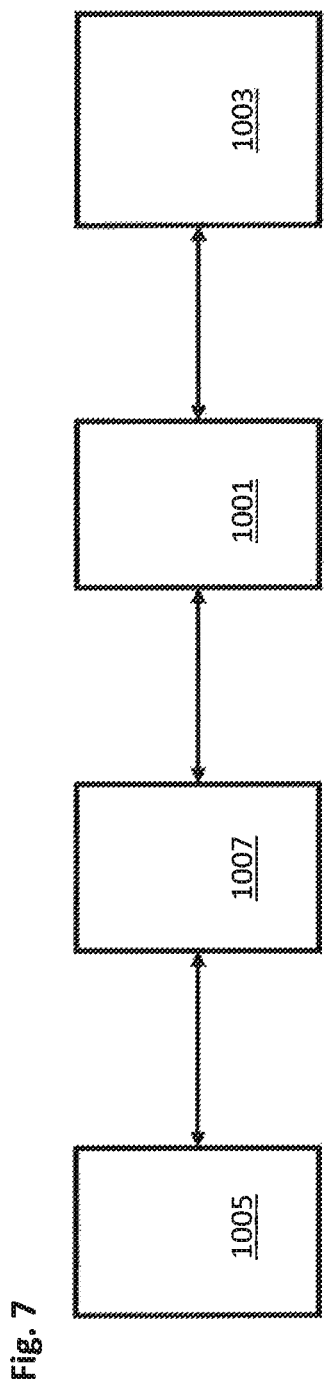
FIG. 7 shows a block diagram of an Ethernet connection.

The block diagram according to FIG. 7 schematically shows, in a simplified view, a standard Ethernet connection with gigabit physics (1000 BASE-T).

The connection comprises a physical interface (also called PHY) 1001 and a transmitter and receiving unit 1003. An RJ45 connector 1005, for example, is used as a contact point, for example as a connector.

The so-called "Reduced Gigabit Media Independent Interface (RGMII)" is usually used as the interface between the physical interface 1001 and the transmitter and receiving unit 1003. This interface is simply referred to only as RGMII below. In the case of the RGMII, four bits are transmitted in a parallel manner at 250 Mbit/s. The interface between the physical interface 1001 and a transformer 1007, which is connected between the RJ45 connector 1005 and the physical interface 1001, or the interface on the cable is a signal in which five voltage levels are respectively transmitted at 125 Mbit/s using four twisted pairs according to the PAM-5 method (PAM: pulse amplitude modulation). This results in a symbol quantity of $5^4=625$ (5 to the power of 4=625) which is transmitted at 125 Mbit/s (the transmission rate of one byte (256 symbols)). Since one byte comprises only 256 symbols, the remaining symbols are used for error correction, as a result of which transmission paths of up to 100 m are achieved between two subscribers.

During full-duplex operation, the twisted pairs are used in a bidirectional manner, the receiver subtracting its transmission signal in order to obtain the reception signal.

The largest portion of the delivery time is produced by the physical interface 1001 which converts the four bits of the RGMII interface into the symbols of the PAM-5 method.

The PAM-5 method is therefore used to transmit signals or data between the RJ45 connector 1005 and the transformer 1007 and between the transformer 1007 and the PHY 1001.

In field bus technology, it is the case that, in many applications, a shorter transmission path between two subscribers, that is to say between two input/output modules for example, suffices here, as a result of which it is possible to use a simpler transmission method in which the signal to be transmitted is directly generated by the transmitter and receiving unit 1003, with the result that a physical interface is not required. This makes it possible to advantageously considerably shorten a delivery time.

In order to avoid having to produce or develop devices, that is to say input/output modules in particular, with two different interfaces, various embodiments of the invention may provide for a physical connection to comprise a switch which can be used to bridge the physical interface. As a result, the same physical connection can be advantageously used both for standard Gbit physics and for a simpler transmission technology with a shorter range.

Such a second physical connection is implemented in order to connect subscribers having an identical voltage potential to as few contacts as possible via a simple contact or plug connection. In the case of this connection, the signals are transmitted bit by bit using only two connections depending on the direction. Only the transmitter and receiver are required for this purpose, which reduces the hardware costs, on the one hand, and the delivery time, on the other hand.

Figure 8:
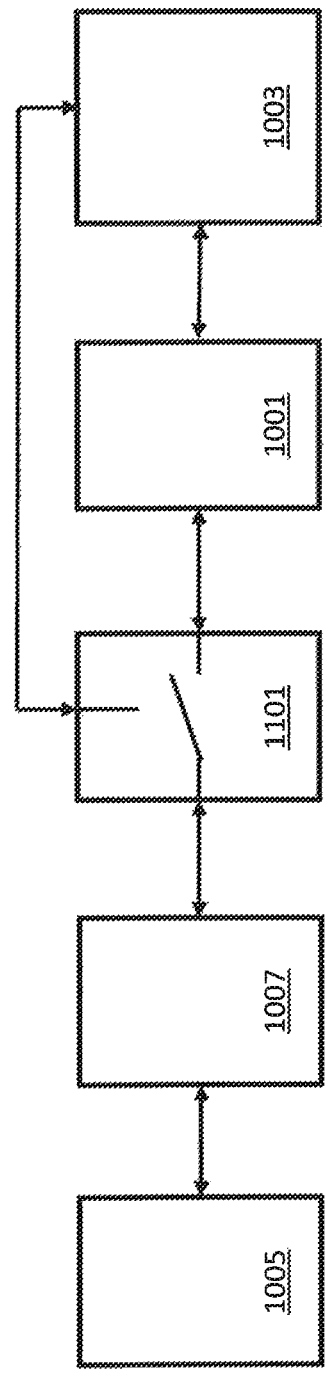
FIG. 8 shows a block diagram of a switchable Ethernet connection.

The switchable physical connection is implemented, for example, according to the block diagram shown in FIG. 8. Provision is made for a switch 1101 to be provided between the transformer 1007 and the physical interface 1001, which switch is configured as a high-frequency switch, for example. A line which connects the switch 1101 to the transmitter and receiving unit 1003 is also formed from this switch 1101. The switch 1101 has two switching states. In the first switching state, the switch 1101 connects the transformer 1007 to the physical interface 1001. In the second switching state, the switch 1101 connects the transformer 1007 directly to the transmitter and receiving unit 1003. That is to say, a switch 1101 is integrated in the physical connection shown in FIG. 8 and can be used to switch the lines for the transformer 1007 either to the physical interface 1001 or directly to the transmitter and receiving unit 1003. The PHY 1001 can therefore be advantageously bridged by means of the switch 1101.

A data transmission method between the switch 1101 and the transmitter and receiving unit 1003 can be carried out, for example, using the "Special Transfer Method." In the case of a connection between two subscribers, that is to say between two input/output modules for example, the following possibilities exist:

1. One subscriber supports only standard Gbit transmission
2. Both subscribers support both transmission methods, but the line length between both subscribers is too long for the simple transmission method
3. Both subscribers support both transmission methods and the line length between both subscribers is short enough for the simple transmission method.

Figure 9:
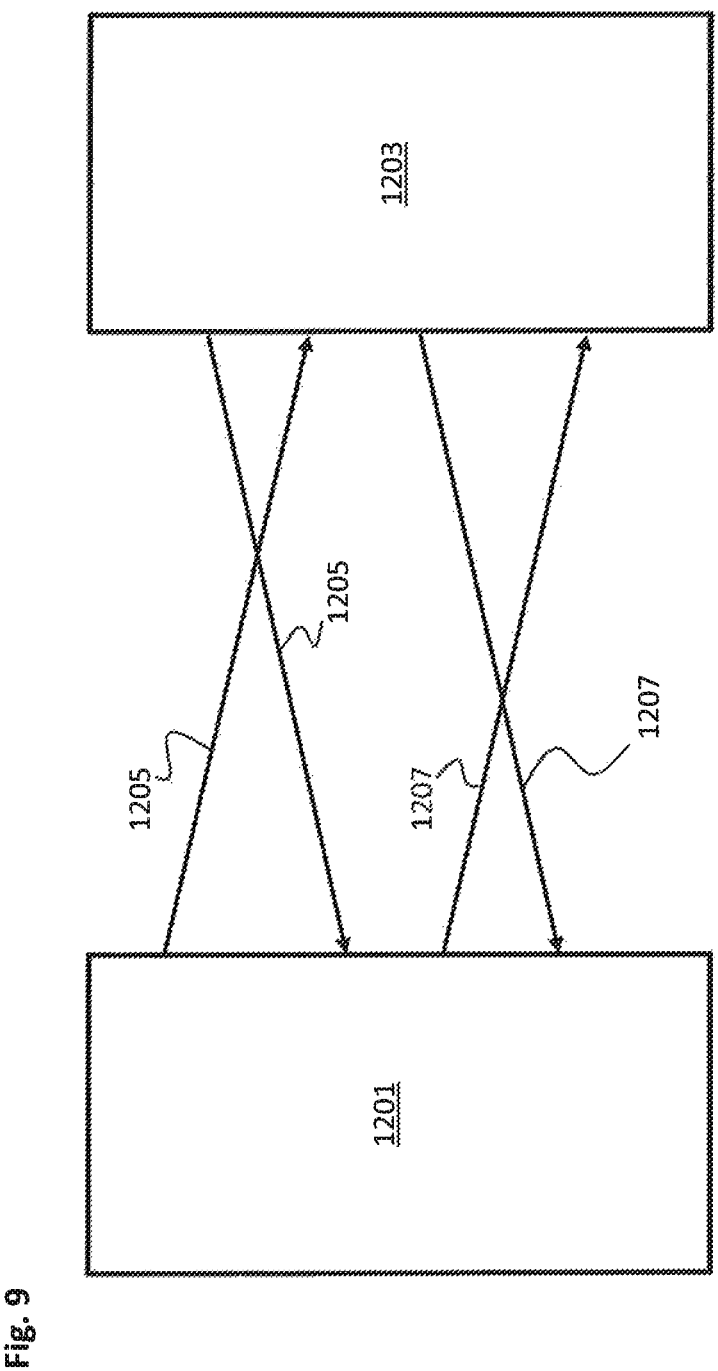
FIG. 9 shows a block diagram for determining a signal transit time between two subscribers of a bus system.

Therefore, according to one embodiment, provision is made for a standard Gbit connection to be initially set up between both subscribers. The respective other subscriber should then be informed that a switchable physical connection is available. If both subscribers have the switchable physical connection, the distance between both subscribers should still be determined using a transit time measurement. For example, the transit time can be determined in a similar manner to the IEEE 1588 method. The block diagram according to FIG. 9 shows, by way of example, an embodiment for carrying out a transit time measurement.

Two subscribers 1201, 1203 which can be configured as an input/output module, for example, are shown. At the time t1_1, the subscriber 1201 transmits a first message 1205 to the subscriber 1203. The message 1205 may be a Simple-PhysicReq message, for example. In this case, the subscriber 1201 stores the transmission time t1_1 of the message 1205.

When the subscriber 1203 receives the message 1205, the subscriber 1203 stores the reception time t2_1 of the message 1205. At the time t3_1, the subscriber 1203 sends a further message 1207, which is configured as a SimplePhysicRes message for example, back to the subscriber 1201. This message 1207 comprises the times t2_1 and t3_1.

The subscriber 1201 receives the message 1207 and stores the reception time t4_1 of the message 1207.

The method described above is carried out in a similar manner starting with the subscriber 1203: at a time t1_2, the subscriber 1203 similarly transmits a message 1205, for example a SimplePhysicReq message, to the subscriber 1201 and stores the transmission time t1_2 of the message 1205. When the subscriber 1201 receives the message 1205, the subscriber 1201 stores the reception time t2_2 of the message 1205. At the time t3_2, the subscriber 1201 sends a further message 1207, which is configured as a SimplePhysicRes message for example, back to the subscriber 1203. This message 1207 comprises the times t2_2 and t3_2. The subscriber 1203 receives the message 1207 and stores the reception time t4_2 of the message 1207.

Both subscribers 1201, 1203 now each have four times t1_1 to t4_1 and t1_2 to t4_2. The subscriber 1201 calculates the transit time as follows:

$$\text{Transit time} = ((t4\_1 - t1\_1) - (t3\_1 - t2\_1))/2.$$

The subscriber 1203 calculates the transit time as follows:

$$\text{Transit time} = ((t4\_2 - t1\_2) - (t3\_2 - t2\_2))/2.$$

Both subscribers 1201, 1203 determine or calculate a distance between themselves and the other subscriber on the basis of their respective determined transit time.

If the calculated distance is below a permitted distance for simple transmission, one embodiment provides for the subscribers 1201, 1203 to come to an understanding on this. In this respect, both subscribers 1201, 1203 then switch to the simple transmission method. This is because both subscribers 1201, 1203 comprise a switchable connection according to the block diagram in FIG. 8. If the distance is above the permitted distance for simple transmission, switching is not carried out.

Figure 10:
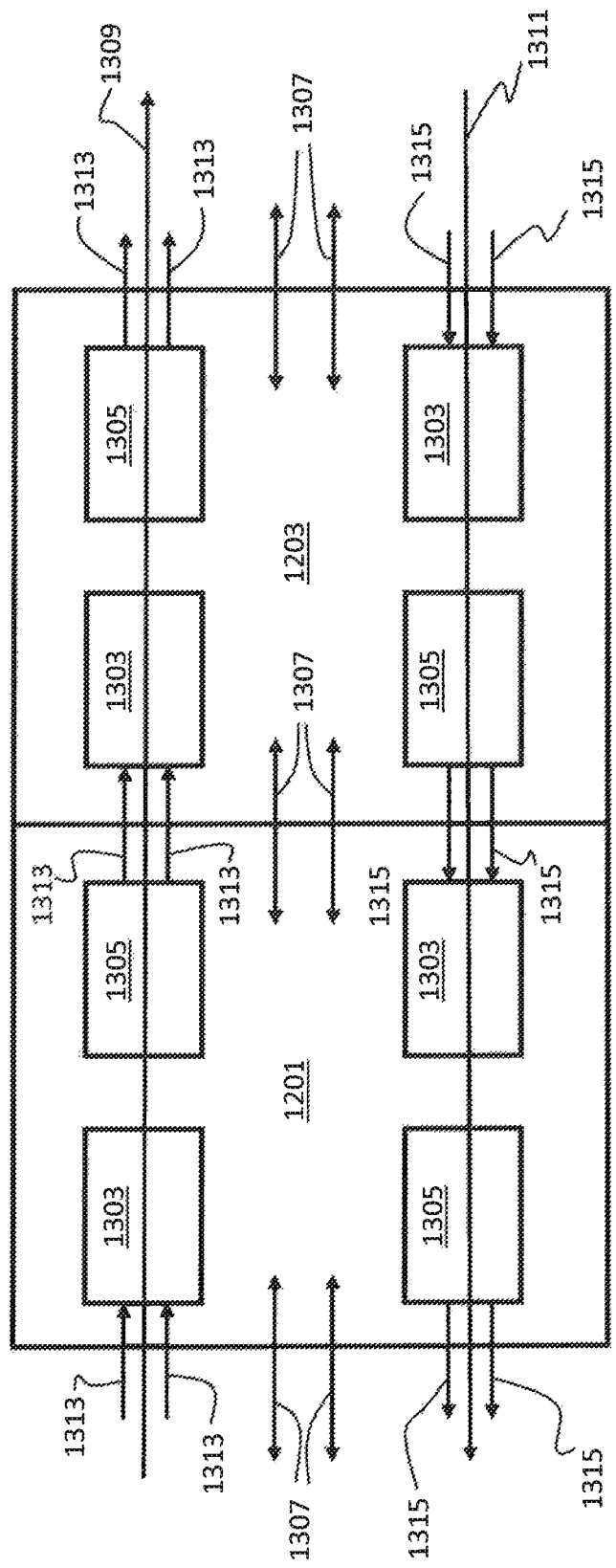
FIG. 10 shows a block diagram of a G-bus.

FIG. 10 shows a block diagram of a G-bus 1301. The G-bus is a pluggable physical connection to two subscribers, which may be configured as an input/output module for example, with six lines, for example six wires, one pair of lines (pair of wires) of which and also a third pair of lines (third pair of wires) are used to transmit a voltage depending on the transmission direction.

The G-bus 1301 according to the block diagram in FIG. 10 is constructed as follows:

Two subscribers 1201, 1203 are connected to one another via two pairs of wires comprising two wires 1315 or two wires 1313. A third pair of wires comprising two wires 1307 is symbolically illustrated by means of double-headed arrows and likewise connects the two subscribers 1201, 1203 and is used for a voltage supply.

A first transmission direction from the subscriber 1201 and the subscriber 1203 is symbolically illustrated using an arrow having the reference symbol 1309. The transmission direction 1311, opposite this transmission direction 1309, from the subscriber 1203 to the subscriber 1201 is symbolically illustrated using an arrow having the corresponding reference symbol 1311. The wires for transmitting data according to the transmission direction 1309 are symbolically illustrated using arrows having the reference symbols 1313. Wires of the pair of wires for transmitting data according to the transmission direction 1311 are symbolically illustrated using arrows having the reference symbols 1315.

Depending on the transmission direction 1309, 1311, the subscribers 1201, 1203 comprise transmitters 1305 and receivers 1303. Signals are transmitted bit by bit according to the SerDes method (SerDes: serializer/deserializer), in which case 8 bits coded as 10 bits are transmitted at 1.25 GHz.

Since cables, transformers or physical interfaces are no longer required between the transmitter 1305 and the receiver 1303 in the G-bus 1301, this connection is particularly cost-effective and has a minimum delivery time.

Figure 11:
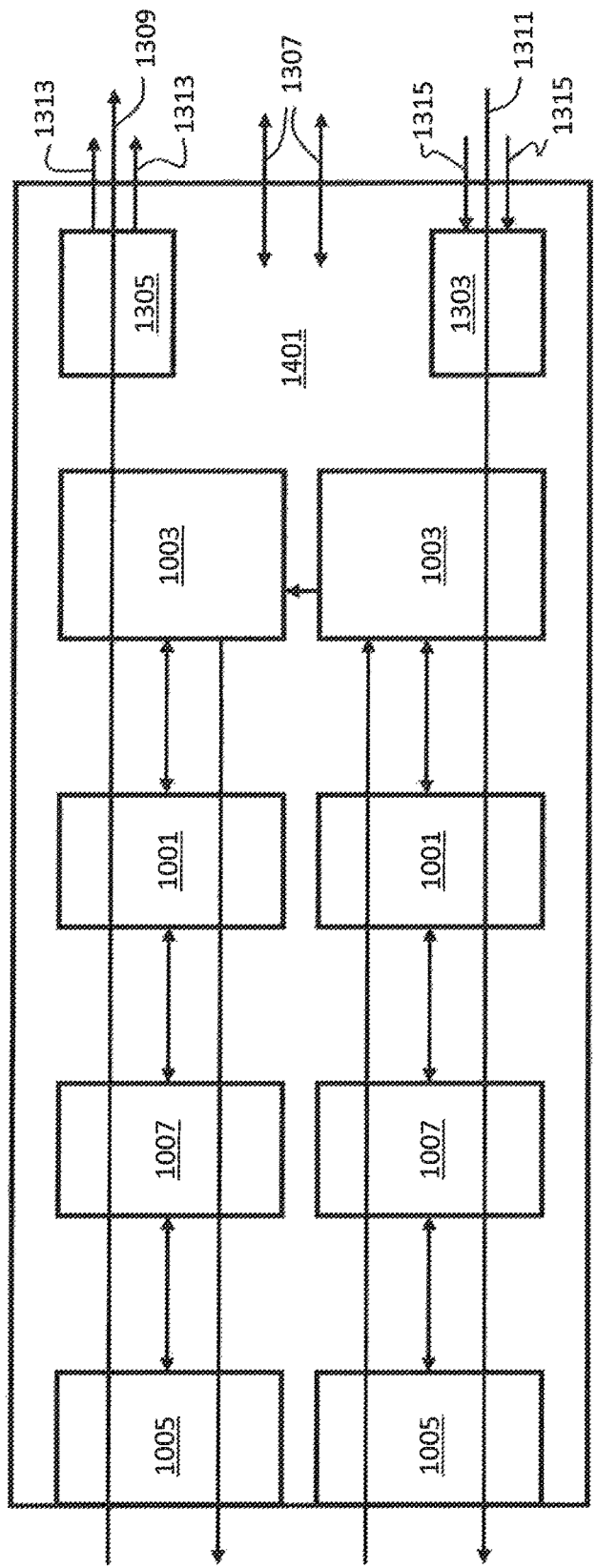
FIG. 11 shows a block diagram of a G-bus converter.

FIG. 11 shows, by way of example, a block diagram of a G-bus converter 1401 in a simplified manner. In order to be able to also connect subscribers having a G-bus connection to standard Gbit subscribers, a converter 1401 according to FIG. 11 is provided and converts either a switchable physical connection or the standard Gbit connection to G-bus. According to FIG. 11, the converter 1401 comprises two standard Gbit connections and one G-bus connection. The arrows illustrated in FIG. 11 are intended to symbolically symbolize a data transmission direction and a voltage transmission direction (in the case of the double-headed arrows 1307).

Figure 12:
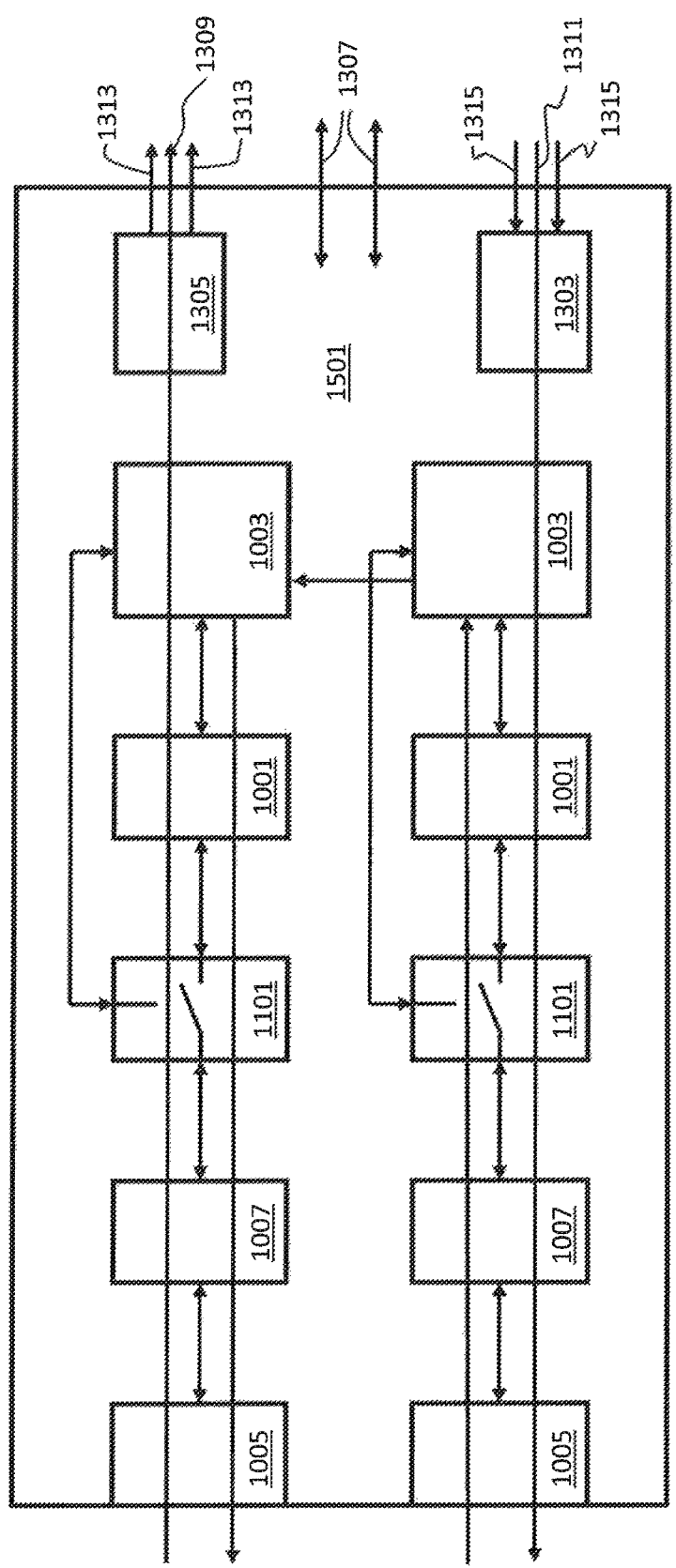
FIG. 12 shows a block diagram of a switchable G-bus converter.

FIG. 12 shows a switchable G-bus converter 1501 which comprises two switches 1101 in a similar manner to FIG. 8 in order to bridge the physical interface 1001. The arrows illustrated in FIG. 12 are intended to symbolically symbolize a data transmission direction and a voltage transmission direction (in the case of the double-headed arrows 1307).

Provision is therefore made for different physical interfaces to be used for shorter distances in order to be able to transmit EtherCAT at 1 Gbit/s, in particular 10 Gbit/s, with a short transit time, for example. Furthermore, a switchable connection (formed by the switch 1101) is provided according to one embodiment and can switch between faster physical transmission with a shorter range and standard Ethernet Gbit (10 Gbit/s or more) according to the connected subscribers.

The switch 1101 described in connection with the statements made above is provided, for example, in the input/output module 3 from FIG. 1 in order to bridge the physical interface 391 there according to the block diagrams in FIGS. 8 and 12.

This invention has been described with respect to exemplary embodiments. It is understood that changes can be made and equivalents can be substituted to adapt these disclosures to different materials and situations, while remaining with the scope of the invention. The invention is thus not limited to the particular examples that are disclosed, but encompasses all the embodiments that fall within the scope of the claims.

What is claimed is:

1. An input/output module for a bus system, having a socket, five contact cups of which each comprise an electrical contact, with:
   a first DC voltage applied to respective electrical contacts of two of the five contact cups by a first switching device,
   a second DC voltage applied to respective electrical contacts of two others of the five contact cups by a second switching device,
   a first differential data signal applied to the respective electrical contacts of the two of the five contact cups,
   a second differential data signal applied to the respective electrical contacts of the two others of the five contact cups; and
   a measuring device for detecting a connector of a four-wire data cable, which measuring device is configured to detect, when the connector is inserted into the socket, whether the connector comprises four or five electrical contact pins which are each plugged into one of the contact cups and are electrically connected to the respective electrical contacts of the contact cups,
   the measuring device being configured to close the two first and second switching devices only when five electrical contact pins are detected in order to apply the first and second DC voltage to the corresponding contact pins of the connector plugged into the socket via the respective electrical contacts of the contact cups,
   wherein the two differential data signals and the two DC voltages are isolated from one another.

2. An input/output module for a bus system according to claim 1, comprising:
   a first DC voltage supply for the first DC voltage and a second DC voltage-supply for the second DC voltage, and
   a physical interface, a first transformer, a second transformer, a first inductive subassembly, a second inductive subassembly, a first capacitive subassembly, a second capacitive subassembly, the first switching device and the second switching device;
   the first DC voltage supply being configured to be electrically connected to the respective electrical contacts of the two of the five contact cups via the first inductive subassembly by the first switching device,
   the second DC voltage supply being configured to be electrically connected to the respective electrical contacts of the two others of the five contact cups via the second inductive subassembly by the second switching device,
   the physical interface being electrically connected to the respective electrical contacts of the two of the five contact cups via the first transformer and via the first capacitive subassembly in order to apply the first differential data signal to the respective electrical contacts of the two of the five contact cups,
   the physical interface being electrically connected to the respective electrical contacts of the two others of the five contact cups via the second transformer and via the second capacitive subassembly in order to apply the second differential data signal to the respective electrical contacts of the two others of the five contact cups.

3. The input/output module according to claim 2,
   the measuring device being configured to apply an electrical measurement voltage between the electrical contact of a fifth contact cup of the five contact cups, which differs from the two of the five contact cups and the two others of the five contact cups, and an electrical reference contact, and to measure an electrical current flowing between the electrical reference contact and the electrical contact of the fifth contact cup, the electrical reference contact being electrically insulated from the electrical contact of the fifth contact cup,
   the measuring device being configured to close the two switching devices when an electrical current flowing between the electrical reference contact and the electrical contact of the fifth contact cup is measured when an electrical measurement voltage is applied.

4. The input/output module according to claim 3, the measuring device comprising a transistor which is configured to switch on in the case of an electrical current flowing between the electrical reference contact and the electrical contact of the fifth contact cup, the measuring device being configured to detect when the transistor switches on and to close the two switching devices when switching-on of the transistor is detected.

5. The input/output module according to claim 3, the measuring device being configured to determine, on the basis of the applied measurement voltage and the measured electrical current, what type of electrical component integrated in the connector has formed an electrical connection between the electrical reference contact and the electrical contact of the fifth contact cup.

6. The input/output module according to claim 5, the measuring device being configured to determine an electrical property of the electrical component.

7. The input/output module according to claim 3, the measuring device being configured to determine a property of the data cable plugged into the socket on the basis of the applied measurement voltage and the measured electrical current.

8. The input/output module according to claim 2,
   the measuring device comprising an electrical switching contact, and
   the electrical contact of the fifth contact cup, which differs from the two of the five contact cups and the two others of the five contact cups, being movably mounted, such that, when an electrical contact pin of the connector is inserted into the fifth contact cup, the electrical contact pin inserted into the fifth contact cup moves the movably mounted electrical contact, such that the latter movably mounted electrical contact actuates the electrical switching contact,
   the measuring device being configured to close the two switching devices when the electrical switching contact is actuated.

9. The input/output module according to claim 2, the measuring device being configured to check, via the electrical contact of the fifth contact cup, which differs from the two of the five contact cups and the two others of the five contact cups, whether a programmable memory is integrated in the connector as an electrical component and to close the two switching devices on the basis of the check.

10. A method for operating an input/output module having a socket, five contact cups of which each comprise an electrical contact, the method comprising:
a first DC voltage being applied to respective electrical contacts of two of the five contact cups by a first switching device,
a second DC voltage being applied to respective electrical contacts of two others of the five contact cups by a second switching device,
a first differential data signal being applied to the respective electrical contacts of the two of the five contact cups,
a second differential data signal being applied to the respective electrical contacts of the two others of the five contact cups,
using a measuring device to detect, when a connector is inserted into a socket, whether the connector comprises four or five electrical contact pins which are each plugged into one of the contact cups and are electrically connected to the respective electrical contacts of the contact cups,
using the measuring device to close the two first and second switching devices only when five electrical contact pins are detected, such that the first and second DC voltage are applied to the respective contact pins of the connector plugged into the socket via the respective electrical contacts of the contact cups on account of the closed switching devices
wherein the two differential data signals and the two DC voltages are isolated from one another.

11. The method according to claim 10, also comprising:
using the measuring device to apply an electrical measurement voltage between the electrical contact of a contact cup of the five contact cups and an electrical reference contact, and
using the measuring device to measure whether an electrical current flows between the reference contact and the electrical contact of the contact cup,
using the measuring device to close the two switching devices when an electrical current flowing between the electrical reference contact and the electrical contact of the contact cup is measured when an electrical measurement voltage is applied.

12. The method according to claim 10, also comprising:
using the measuring device to close the two switching devices if the measuring device detects switching-on of a transistor.

13. The method according to claim 11, also comprising:
using the measuring device to determine, on the basis of the applied measurement voltage and the measured electrical current, what type of electrical component integrated in the connector has formed an electrical connection between the electrical reference contact and the electrical contact of the contact cup.

14. The method according to claim 13, also comprising:
using the measuring device to determine an electrical property of the electrical component.

15. The method according to claim 10, also comprising:
using the measuring device to determine a property of a data cable plugged into the socket on the basis of the applied measurement voltage and the measured electrical current.

16. The method according to claim 10, also comprising:
using the measuring device to close the two switching devices if an electrical switching contact is actuated.

17. The method according to claim 10, also comprising:
using the measuring device to check, via the electrical contact of the contact cup, whether a programmable memory is integrated in the connector as an electrical component,
using the measuring device to close the two switching devices on the basis of the check.

18. A bus system having:
an input/output module, the input/output module comprising:
a socket, five contact cups of which each comprise an electrical contact, two DC voltages and two differential data signals being applicable to four of the five contact cups, wherein the two differential data signals and the two DC voltages are isolated from one another; and
a data cable comprising:
two pairs of wires,
a connector with five electrical contact pins and a shield, four of the five electrical contact pins being electrically connected to respective wires of the two pairs of wires,
at least one electrical component being connected between a fifth of the electrical contact pins and the shield, the at least one electrical component being selected from the following group of electrical components: resistor, inductance, capacitor, diode, and programmable memory, and
electrical properties of the electrical component coding a data cable length and/or operating parameters of the input/output module;
wherein the connector is inserted into the socket, the four contact cups each accommodating a corresponding one of the four electrical contact pins, a fifth contact cup accommodating the fifth electrical contact pin.

19. The bus system according to claim 18, a property of the data cable being stored in the programmable memory.

* * * * *